United States Patent
Takahashi

(10) Patent No.: US 7,561,126 B2
(45) Date of Patent: Jul. 14, 2009

(54) METHOD OF DRIVING ELECTROLUMINESCENT DEVICE

(75) Inventor: Kenichi Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 1016 days.

(21) Appl. No.: 10/425,245

(22) Filed: Apr. 29, 2003

(65) Prior Publication Data
US 2004/0041751 A1    Mar. 4, 2004

(30) Foreign Application Priority Data
May 1, 2002   (JP)   ............................. 2002-129540

(51) Int. Cl.
*G09G 3/30*   (2006.01)
(52) U.S. Cl. ......................................... 345/77; 345/76
(58) Field of Classification Search ............ 345/76–101
See application file for complete search history.

(56) References Cited

U.S. PATENT DOCUMENTS

| | | | |
|---|---|---|---|
| 5,990,629 A * | 11/1999 | Yamada et al. ........... 315/169.3 |
| 6,215,462 B1 * | 4/2001 | Yamada et al. ................. 345/76 |
| 6,392,620 B1 * | 5/2002 | Mizutani et al. ............... 345/88 |
| 6,864,869 B2 * | 3/2005 | Udo et al. ....................... 345/89 |
| 6,872,973 B1 * | 3/2005 | Koyama et al. ............... 257/59 |
| 2002/0180721 A1 * | 12/2002 | Kimura et al. .............. 345/211 |

* cited by examiner

*Primary Examiner*—Srilakshmi K Kumar
(74) *Attorney, Agent, or Firm*—Robert J. Depke; Rockey, Depke & Lyons, LLC.

(57) ABSTRACT

An electroluminescent device, in which a layer having a light emitting region is provided between an anode and a cathode, is driven by applying a bipolar waveform as a drive waveform per one image display period to the device. The one image display period is divided into a light emitting period and a non-light emitting period. The bipolar waveform per one image display period is set such that a waveform portion (current or voltage) for generating an electric field reversed to an electric field caused in the light emitting period is applied in the non-light emitting period, and that an integral intensity obtained by multiplying a voltage value by an applied time in the light emitting period is balanced with or canceled by an integral intensity obtained by multiplying a voltage value by an applied time in the non-light emitting period. Since the optimized drive waveform is applied to the electroluminescent device, it is possible to realize a high reliability and a long-term service life of the device.

21 Claims, 17 Drawing Sheets

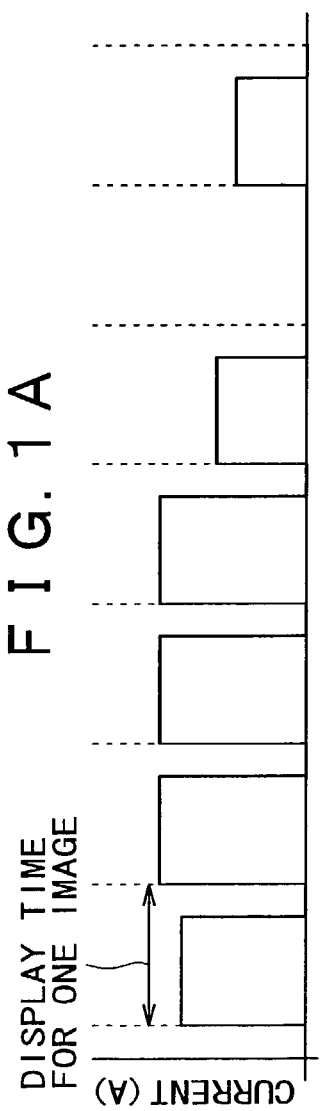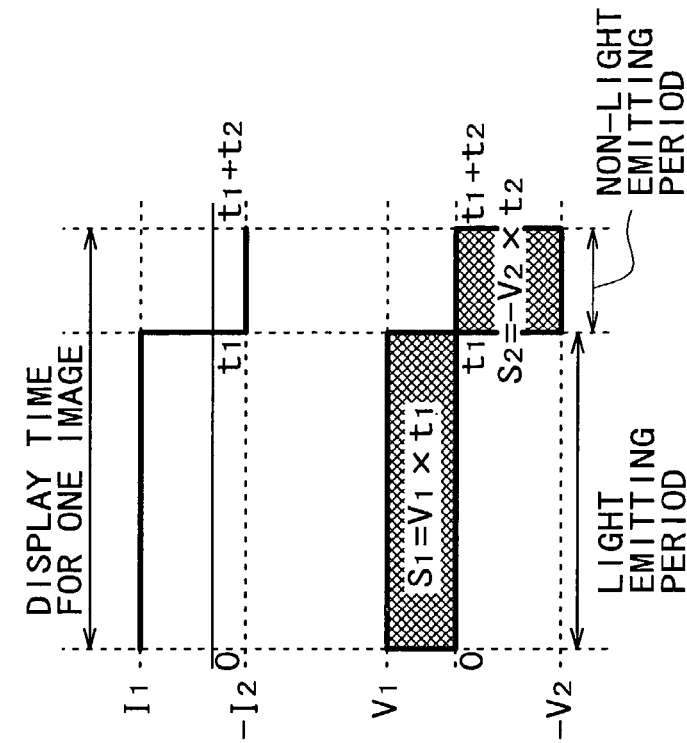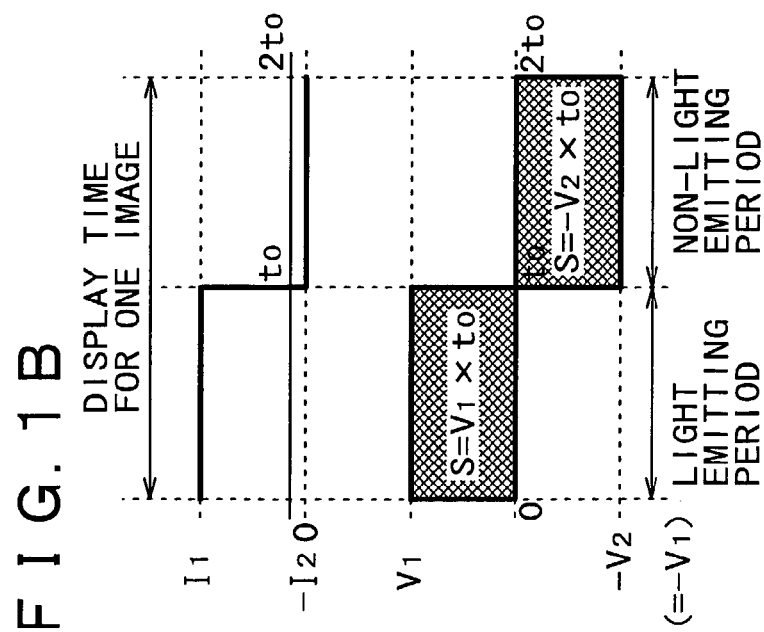

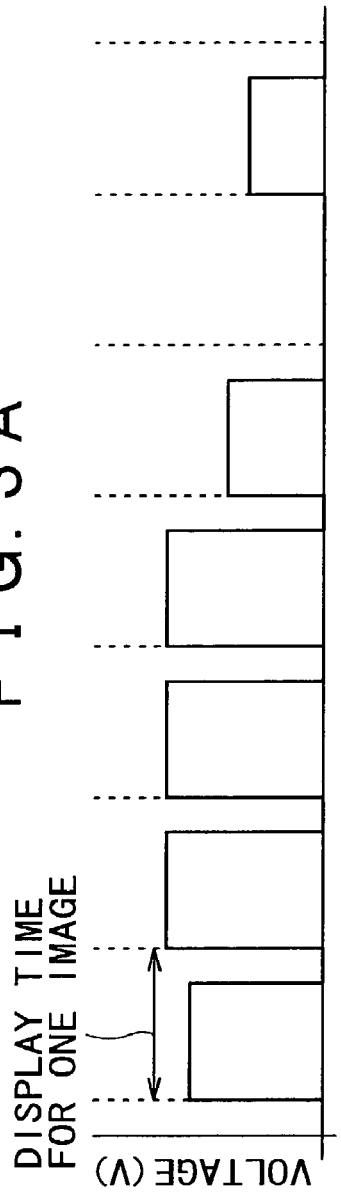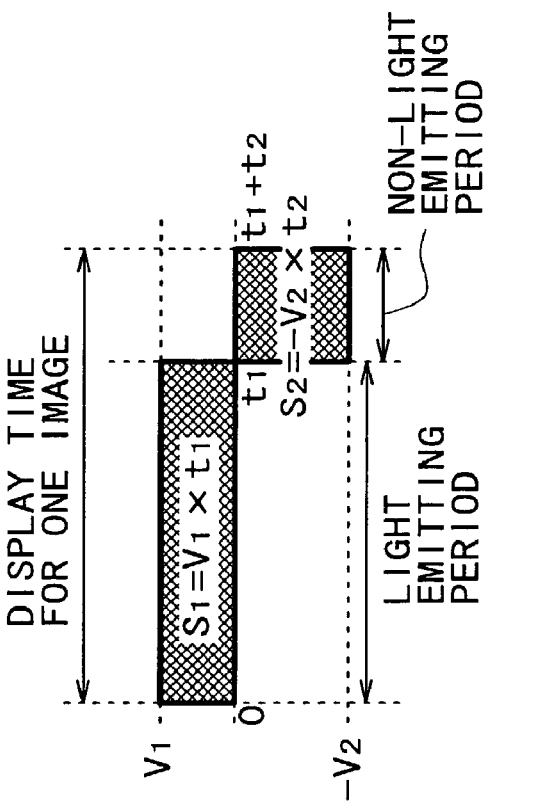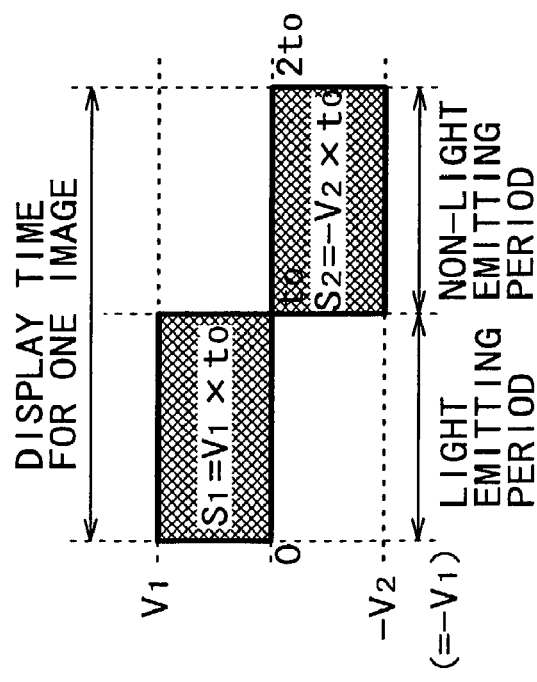

F I G. 5
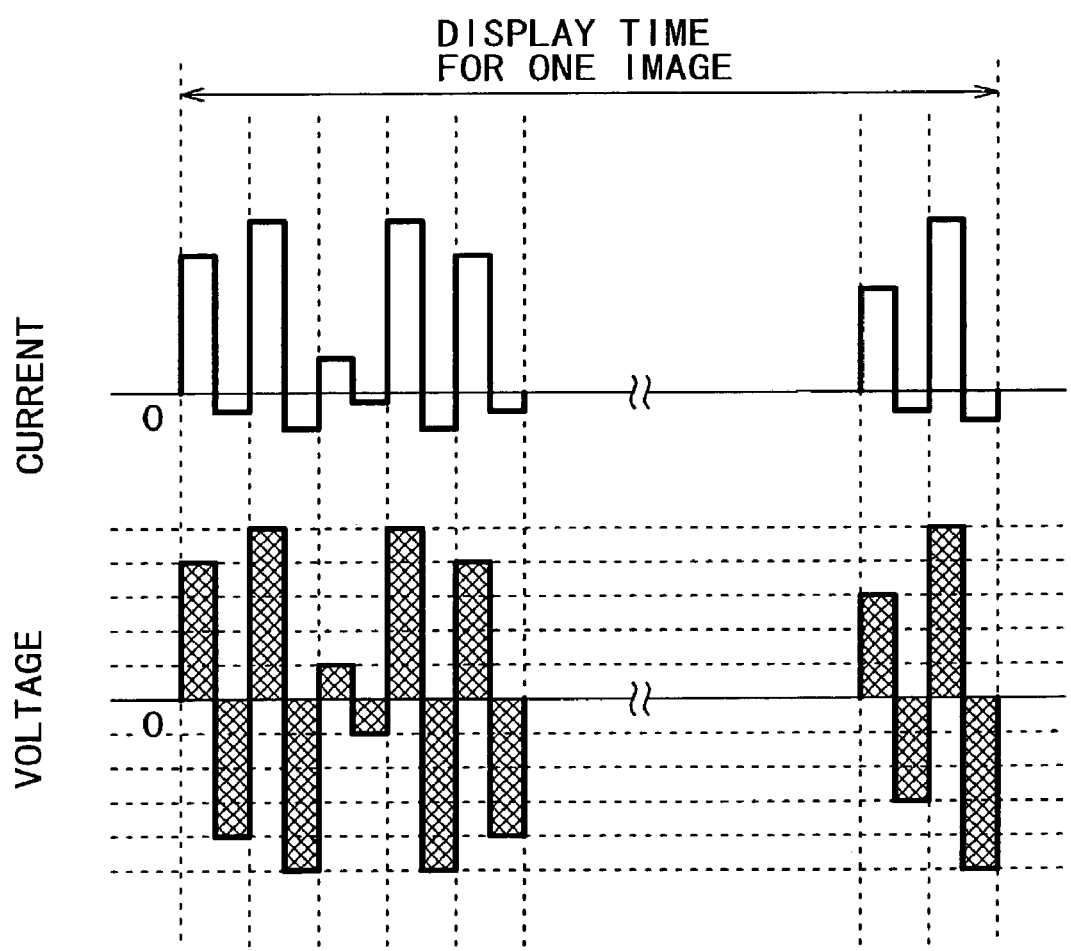

| DUTY RATIO(%) | $V_1$ VALUE | $I_1$(mA/cm$^2$) | $-V_2$ VALUE | $-I_2$(mA/cm$^2$) |
|---|---|---|---|---|
| 5 | 4.3 | 1.41 | −0.23 | $-5.1 \times 10^{-7}$ |
| 10 | 4.3 | 1.41 | −0.48 | $-5.4 \times 10^{-7}$ |
| 30 | 4.3 | 1.41 | −1.84 | $-8.7 \times 10^{-7}$ |
| 50 | 4.3 | 1.41 | −4.3 | $-2.8 \times 10^{-6}$ |
| 70 | 4.3 | 1.41 | −10 | $-2.2 \times 10^{-5}$ |
| 75 | 4.3 | 1.41 | −12.98 | $-4.1 \times 10^{-5}$ |
| 80 | 4.3 | 1.41 | −17.2 | — |
| 90 | 4.3 | 1.41 | −38.7 | — |
| 95 | 4.3 | 1.41 | −81.7 | — |

F I G. 1 6 A
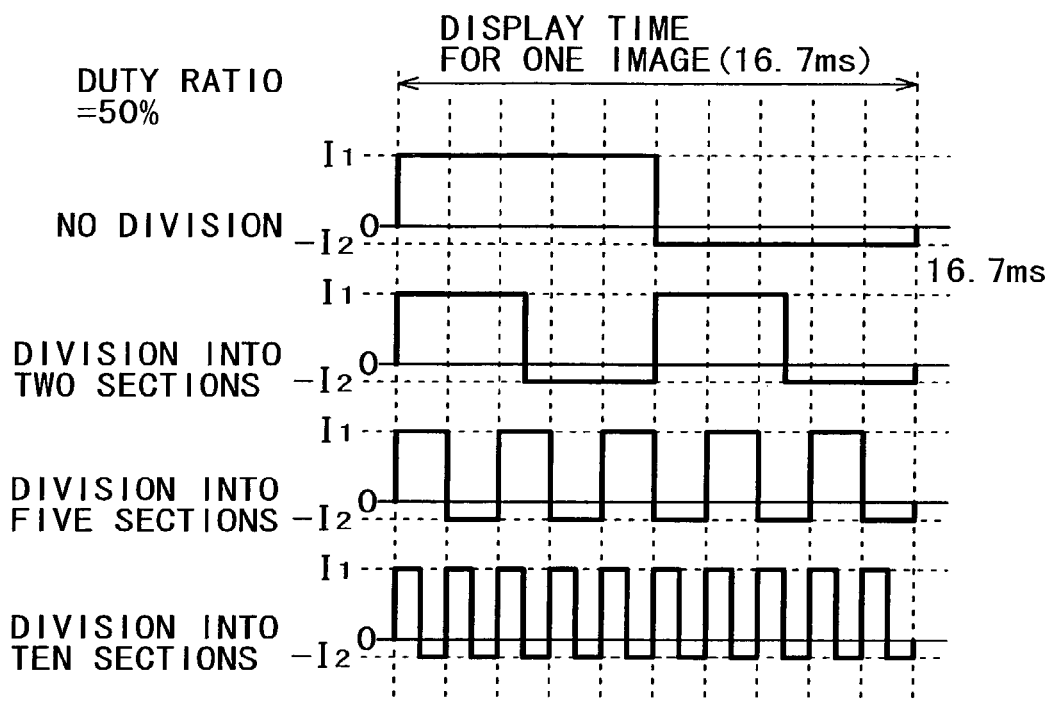
F I G. 1 6 B
| NUMBER OF DIVISION | $V_1$ VALUE | $I_1$(mA/cm$^2$) | $-V_2$ VALUE | $-I_2$(mA/cm$^2$) |
|---|---|---|---|---|
| 2 | 4.3 | 1.41 | −4.3 | $-2.8 \times 10^{-6}$ |
| 5 | 4.3 | 1.41 | −4.3 | $-2.8 \times 10^{-6}$ |
| 10 | 4.3 | 1.41 | −4.3 | $-2.8 \times 10^{-6}$ |

METHOD OF DRIVING ELECTROLUMINESCENT DEVICE

This application claims priority to Japanese Patent Application Number JP2002-129540, filed May 1, 2002, which is incorporated herein by reference.

BACKGROUND OF THE INVENTION

The present invention relates to a method of driving an electroluminescent device (EL device) configured such that a layer having a light emitting region is provided between an anode and a cathode.

Cathode-ray tubes (CRT) having high luminance and high color reproducibility have been most widely employed as displays; however, they are bulky and heavy, and high in power consumption. On the other hand, lightweight, highly efficient flat panel displays have been actively studied and developed, for example, for picture display of computers and television sets.

For example, liquid crystal displays of an active matrix driven type or the like have been put on the market as lightweight, highly efficient flat panel displays.

Liquid crystal displays, however, have problems that the viewing angle is narrow, the power consumption of a back light is large under a dark environment because of the use of no spontaneous light, the response to high-speed video signals of high definition is insufficient although such a response characteristic is expected to be put to practical use in future, and an after-image phenomenon occurs. In particular, liquid crystal displays with large screen sizes have a further problem that the production costs are raised because of difficulties in producing such large-sized liquid crystal displays.

It may be considered to use displays incorporating light-emitting diodes in place of CRTs. Such displays, however, are also high in production costs and have difficulties in forming a matrix structure of light-emitting diodes on one substrate. Accordingly, displays of this type have a problem to be solved before the displays are put to practical use as low-cost substitutes for CRTs.

In recent years, organic electroluminescent devices (organic EL devices) using organic luminescent materials have become a focus of interest as flat panel displays capable of solving these problems. These organic EL devices using organic compounds as luminous materials are expected as flat panel displays of a type which makes use of spontaneous light, exhibits high response speeds, and have no dependence on viewing angle.

Organic electroluminescent devices are configured by forming an organic thin film, which contains a luminescent material that emits light by injection of a current, between a translucent anode and a metal cathode.

C. W. Tang and S. A. VanSlyke have disclosed a device structure (an organic EL device having a single-hetero structure) in Applied Physics Letters, Vol. 51, No. 12, pp. 913-915 (1987). This device structure has a double-layered structure including an organic thin film made from a hole transport material and an organic thin film made from an electron transport material, wherein light emission occurs by re-combination of holes and electrons injected from respective electrodes into the organic thin films. In this device structure, either of the hole transport material or the electron transport material serves as a luminescent material, and emits light in a wavelength band corresponding to an energy gap between a ground state and an excited state of the luminescent material. The organic EL device using such a double-layered structure is advantageous in significantly reducing a drive voltage and improving the luminous efficiency.

Since then, C. Adachi, S. Tokita, T. Tsutsui, and S. Saito have disclosed a three-layered structure (organic EL device having a double-hetero structure) in Japanese Journal of Applied Physics, Vol. 27, No. 2, pp. L269-L271 (1988). The three-layered structure has three layers made from a hole transport material, a luminescent material, and an electron transport material. C. W. Tang, S. A. VanSlyke, and C. H. Chen have disclosed a device structure that a luminescent material is contained in an electron transport material in Journal of Applied Physics, Vol. 65, No. 9, pp. 3610-3616 (1989). These researches have suggested that light emission with high luminance at a low voltage may be possible, and on the basis of such suggestion, studies have been very actively made to develop new type organic EL devices.

Organic compounds used as luminescent materials are advantageous in that since such organic compounds have a diversity in kind, the color of light emitted from a light emitting layer can be freely changed in theory by selecting an organic compound, which has a molecular structure suitable for emission of light of a desired color, as a luminescent material forming the light emitting layer. Accordingly, as compared with thin film EL devices using inorganic devices, it is easier to obtain organic EL devices having devices allowing emission of light of reds (R), green (G), and blue (B) with good color purities necessary for full-color display.

Metal complex materials containing organic ligands coordinated around metal ions, which are not organic materials in the strict sense of the word, have been used as electroluminescent device materials. Such metal complex materials generally belong to the category of organic EL device materials.

A typical example of the metal complex material includes tris(8-quinolinol)aluminum with three molecules of 8-quinolinol coordinated around an aluminum ion. This metal complex material is hereinafter referred to as "Alq$_3$". The light emission of Alq$_3$ is due to fluorescence from the $\pi$-$\pi$* excited state locally present in the coordinated 8-quinolinol molecules, and therefore, it may be regarded as light emission from an organic matter.

In recent years, along with diversification of materials, complex materials, which have a structure that ligands are coordinated around a transition metal and a rare earth metal, wherein light emission occurs by MLCT (metal-to-ligand charge transfer) or LMCT (ligand-to-metal charge transfer), have become a focus of interest of luminescent materials.

Like the above-described organic compounds used as luminescent materials, metal complex materials used as luminescent materials are advantageous in that since such metal complex materials have a diversity in kind, the color of light emitted from a light emitting layer can be freely changed in theory by selecting a metal complex material, which contains organic ligands having a combination and molecular structures suitable for emission of light of a desired color, as a luminescent material forming the light emitting layer.

In recent years, study and development using phosphorescence in place of fluorescence from the viewpoint of improvement of luminous efficiency have become noticeable. In the case of using a metal complex, since an atomic mass of a center metal is large and its atomic cloud is spread, a probability of intersystem crossing between excited states is increased, which leads to expectation for light emission from a triplet excited state lower than a singlet excited state, that is, phosphorescence.

High molecular EL devices using high molecular materials as luminescent materials have been extensively developed. As compared with a low molecular material, a high molecular material is advantageous in relatively easily forming a light emitting layer not by a vacuum process but by a coating process or a printing process, and is therefore expected as a material capable of shortening a tact time, and reducing an investment for a production apparatus. These high polymer luminescent materials may generally have a structure similar to that of conductive high polymers, and therefore, they are greatly advantageous in allowing the drive of an organic EL device including a luminescent layer made from a high polymer luminescent material at a low voltage.

In general, an organic EL device emits light when a current is applied only in one direction, that is, a voltage having one polarity is applied between electrodes, and therefore, it functions as a diode rectifier allowing the flow of a current and emission of light only by a forward bias. Accordingly, a waveform of a perfect direct current/voltage or a pulse with a single polarity is used for driving a light emitting device.

Such a direct current drive or a single polarity pulse drive of an organic EL device is liable to cause device deterioration for the following reasons (1), (2) and (3).

(1) Polarization of migratable ion species, which are contained as impurities in a device structure, in a single layer or between electrodes, to incidentally or inevitably deteriorate the device.

(2) Ionization of an element originally contained in an electrode material by application of an electric field, followed by elution of the element as migratable ions in the device structure, to change the electric field state of a layer structure precisely designed, thereby causing device deterioration.

(3) Decomposition of an organic material in an excited state.

On the other hand, to realize stability and sustainability of a light emitting device, there have been proposed a drive method by an asymmetric type AC drive with voltage control (Japanese Patent Laid-open No. Hei 8-180972) and a bipolar type drive method (Published Japanese translation of a PCT application No. Hei 11-500574).

The former drive method, however, has a problem that since an organic EL device is driven by current control with its luminous intensity specified, if a resistance change occurs, it fails to sufficiently cope therewith. In other words, such a drive method is disadvantageous in that the condition of optimization of an asymmetric waveform is unclear. The former drive method is intended to cause light emission in band regions of both polarities of a bipolar waveform, and if a device has a substantially ideal device structure with the enhanced luminous efficiency, a diode rectifying characteristic is improved; however, since light emission occurs at the time of reverse bias, the device may be significantly deterioration.

A method of suppressing device deterioration by applying a voltage in the direction reversed to that of a DC voltage between an anode electrode and a cathode electrode has been disclosed in Japanese Patent No. 3169974; however, this document does not sufficiently examine the optimization of the magnitude and timing of the voltage in the direction reversed to that of the DC voltage.

SUMMARY OF THE INVENTION

An object of the present invention is to provide an electroluminescent device capable of realizing a high reliability and a long-term service life which are major problems to be solved, and suppressing an after-image phenomenon frequently occurring in liquid crystal displays.

To achieve the above object, according to a first aspect of the present invention, there is provided a method of driving an electroluminescent device, in which a layer having a light emitting region is provided between an anode and a cathode, by current control using a bipolar type drive waveform. The method includes the steps of dividing a drive waveform in a one image display period into a first drive waveform portion in a light emitting period contributing to light emission of the device and a second drive waveform portion in a non-light emitting period, and supplying a first current having the first drive waveform portion in the light emitting period and a second current having the second drive waveform portion in the non-light emitting period. In this method, a polarity of the first current supplied in the light emitting period is made different from a polarity of the second current supplied in the non-light emitting period; the drive waveform is set to such an asymmetric bipolar type current waveform that an integral intensity obtained by multiplying the absolute value of the first current by a supply time in the light emitting period is different from an integral intensity obtained by multiplying the absolute value of the second current, which has the polarity reversed to that of the first current, by a supply time in the non-light emitting period; and when the first and second currents having the first and second drive waveform portions of the asymmetric bipolar current waveform are supplied, an integral intensity obtained by multiplying a first voltage between electrodes, which voltage is caused by supplying the first current, by the supply time in the light emitting period is balanced with an integral intensity obtained by multiplying a second voltage between electrodes, which voltage is caused by supplying the second current, by the supply time in the non-light emitting period. This method is hereinafter referred to as "first drive method of the present invention".

According to a second aspect of the present invention, there is provided a method of driving an electroluminescent device, in which a layer having a light emitting region is provided between an anode and a cathode, by voltage control using a bipolar type drive waveform. The method includes the steps of dividing a drive waveform in a one image display period into a first drive waveform portion in a light emitting period contributing to light emission of the device and a second drive waveform portion in a non-light emitting period, and applying a first voltage having the first drive waveform portion in the light emitting period and a second voltage having the second drive waveform portion in the non-light emitting period. In this method, a polarity of the first voltage applied in the light emitting period is made different from a polarity of the second voltage applied in the non-light emitting period; and the drive form is set such that an integral intensity obtained by multiplying the first voltage by an applied time in the light emitting period is balanced with an integral intensity obtained by multiplying the second voltage, which has the polarity reversed to that of the first voltage, by an applied time in the non-light emitting period. This method is hereinafter referred to as "second drive method of the present invention".

The present inventor has examined to solve the above-described problems, and found that it becomes possible to realize a long-term service life of an electroluminescent device while keeping a high luminance, even if the device has a conventional structure using conventional materials, by optimizing a drive waveform applied thereto.

In general, an electroluminescent device has a structure of a diode rectifier, wherein a current flows when a voltage having one polarity is applied, whereas a current little flows when a voltage having a reversed polarity is applied. Such a property is called "rectifying characteristic", and a ratio of the flowing current ratio is called "rectification ratio". In a most recent electroluminescent device, the rectification ratio becomes a value ranging from $10^4$ to $10^6$.

On the other hand, in a practical method of driving an electroluminescent device, as is well known, a ratio of a light emission time to a one image display period, that is, a duty ratio is desirable to be increased for enhancing the luminous intensity even with the same applied waveform intensity, and is also desirable to be decreased to some extent for increasing a dark (non-light emitting) state per one image display period in order to suppress an after-image phenomenon upon display of a moving picture and thereby sharpening the image quality.

An electroluminescent device, which is mainly driven with current control, is driven such that a current value is zero, that is, a quasi-circuit state is closed in a dark (non-light emitting) state in a one image display period. Although the closed circuit state is thus kept in the dark state, the device is driven by using a waveform close to a current drive waveform in which a voltage of only one polarity is applied in practice during continuous drive of the device.

Light emitting devices such as liquid crystal devices and plasma light emitting devices have been driven by a drive method close to a DC drive method; however, from the viewpoint of reliability, such a drive method has been shifted to an AC drive method using a bipolar type waveform. As described above, the method of driving an electroluminescent device by an AC drive method with asymmetric voltage control has been proposed; however, such a drive method is now not applied to a high performance display device with the optimized luminous efficiency.

In view of the foregoing, the drive method of the present invention has been accomplished, and is therefore, the drive method is intended to propose a bipolar waveform suitable for a high performance display device with the optimized luminous efficiency.

A quasi-DC drive such as a monopolar type pulse drive of an electroluminescent device is, as described above, liable to cause device deterioration for the following reasons (1), (2) and (3).

(1) Polarization of migratable ion species, which are contained as impurities in a device structure, in a single layer or between electrodes, to incidentally or inevitably deteriorate the device.

(2) Ionization of an element originally contained in an electrode material by application of an electric field, followed by elution of the element as migratable ions in the device structure, to change the electric field state of a layer structure precisely designed, thereby causing device deterioration.

(3) Decomposition of an organic material in an excited state.

In general, in the case of applying a waveform of one polarity in a light emitting period, most of the flowing current is consumed by reaction directly involved in light emission. Even if a component deteriorated by such reaction is slight, the deterioration of the component becomes large as a result of repetition of the reaction. Accordingly, to suppress or moderate such deterioration, it is important to take a suitable measure per one image display period.

The present inventor has examined and found that a suitable drive method can be obtained not by setting a current value to zero (quasi-closed circuit state) in a non-light emitting period within a one image display period but by applying a waveform, which has a polarity reversed to that of a waveform applied in a light emitting period, in the non-light emitting period, and accomplished the present invention.

According to the drive method of the present invention, an electroluminescent device, in which a layer having a light emitting region is provided between an anode and a cathode, is driven by applying a bipolar waveform as a drive waveform per one image display period to the device. The one image display period is divided into a light emitting period and a non-light emitting period. The bipolar waveform per one image display period is set such that a waveform portion (current or voltage) for generating an electric field reversed to an electric field caused in the light emitting period is applied in the non-light emitting period, and that an integral intensity obtained by multiplying a voltage value by an applied time in the light emitting period is balanced with or canceled by an integral intensity obtained by multiplying a voltage value by an applied time in the non-light emitting period.

Preferably, the first drive method of the present invention further includes the steps of; reading a value of the first voltage corresponding to the first current, which current is to be supplied in the light emitting period, from a voltage-current curve; determining a value of the second voltage having a polarity reversed to that of the first voltage in accordance with a duty ratio which is a ratio of the light emitting period to the one image display period; and reading a value of the second current, which corresponds to the second voltage and has a reverse polarity, from the voltage-current curve; wherein the second current whose value is thus calculated is supplied in the non-light emitting period.

In the first and second drive methods of the present invention, preferably, a duty ratio which is a ratio of the light emitting period to the one image display period is in a range of 30 to 70%. With this configuration, it is possible to stably operate the device while keeping a sufficient luminance thereof.

It may be considered that light emission be due to the flow-in of electrons between electrodes of an electroluminescent device, whereas the deterioration of the device be due to ion species. Such ion species are bulky and therefore very small in mobility. Further, if a high frequency drive waveform is applied to an electroluminescent device, ion species little occur by electrode reaction, that is, by ionization of a metal material for forming an electrode. From this viewpoint, preferably, the one image display period is divided into a plurality of sets of the light emitting periods and the non-light emitting periods. With this configuration, since a high frequency drive waveform is applied to the device, it is possible to further improve the deterioration of the device. It is to be noted that since the mobility of ion species is due to the magnitude and applied time of an electric field between electrodes, it is required to make the intensity of a forward electric field equal to the intensity of a reverse electric field for preventing occurrence of ion migration in practice.

BRIEF DESCRIPTION OF THE DRAWINGS

These and other objects, features, and advantages of the present invention will be more apparent from the following description in conjunction with the accompanying drawings, wherein:

FIG. 1A is a diagram showing a drive waveform of current before being optimized by a drive method of the present invention, and FIGS. 1B and 1C are diagrams each showing drive waveforms in a light emitting period and a non-light emitting period within a one image display period, which are optimized by the drive method of the present invention;

FIG. 3A is a diagram showing a drive waveform of voltage before being optimized by a drive method of the present invention, and FIGS. 3B and 3C are diagrams each showing drive waveforms in a light emitting period and a non-light emitting period within a one image display period, which are optimized by the drive method of the present invention;

FIG. 5 is a diagram showing one example of further modifying the drive waveforms obtained by the drive method of the present invention;

FIG. 16A is a diagram showing drive waveforms in a one image display period wherein each drive waveform is divided into a plurality of parts, which waveforms are applied to the organic electroluminescent device having the device structure 1 in Examples 10 to 12 of the present invention, and FIG. 16B is a table showing current values and voltage values of the drive waveforms shown in FIG. 16A;

DETAILED DESCRIPTION OF THE PREFERRED EMBODIMENTS

Hereinafter, preferred embodiments of the present invention will be described in detail with reference to the drawings.

FIG. 1A shows a drive waveform applied to a specific pixel before optimized by a current control drive method of the present invention, and FIGS. 1B and 1C show drive waveforms optimized by the current control drive method of the present invention, wherein FIG. 1B shows the drive waveform when the duty ratio is set to 50%, and FIG. 1C shows the drive waveform when the duty ratio is set to a value other than 50%.

Figure 2:
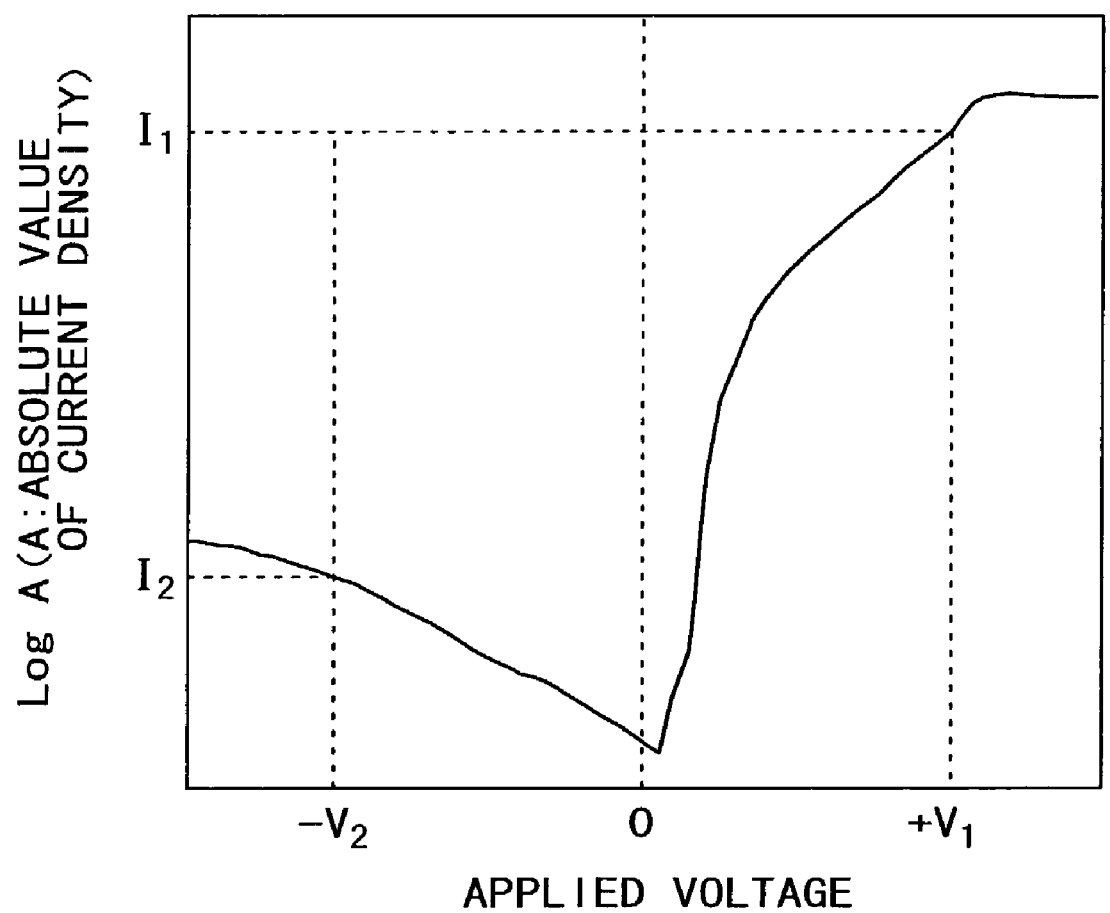
FIG. 2 is a current-voltage curve used for determining the waveforms shown in FIGS. 1B and 1C.

FIG. 2 is a current-voltage curve used for determining the waveforms shown in FIGS. 1B and 1C.

According to the method of driving an organic electroluminescent (EL) device with current control in accordance with the present invention, a current waveform in a one image display period is optimized as follows.

When the duty ratio is set to 50% and thereby a one image display period is divided into 50% of a light emitting period (0 to $t_0$) and 50% of a non-light emitting period ($t_0$ to $2t_0$) as shown in FIG. 1B, assuming that a current ($+I_1$) is to be supplied in the light emitting period, a current to be applied in the non-light emitting period can be determined on the basis of the following calculation steps (1), (2), and (3).

(1) A voltage ($+V_1$) corresponding to the current ($+I_1$) is read from the voltage-current curve shown in FIG. 2.

(2) A voltage ($-V_2$) in the non-light emitting period, which has a polarity reversed to that of the voltage ($+V_1$), is obtained by satisfying a relationship that an integral value $[+V_1 \times (t_0-0)]$ of the voltage ($+V_1$) in the light emitting period is equal to an integral value $[-V_2 \times (2t_0-t_0)]$ of the voltage ($-V_2$) in the non-light emitting period. It is to be noted that when the duty ratio of 50%, the value $V_2$ is equal to the value $V_1$.

(3) A current ($-I_2$) corresponding to the voltage ($-V_2$) is read from the voltage-current curve shown in FIG. 2.

The current ($-I_2$) thus obtained is a current to be supplied in the non-light emitting period.

Such a current waveform is optimized such that as shown in FIG. 1B, the integral intensity $[+I_1 \times (t_0-0)]$ of the current ($+I_1$) in the light emitting period is not equal to the integral intensity $[-I_2 \times (2t_0-t_0)]$ of the current ($-I_2$) in the non-light emitting period, whereas the integral intensity $[+V_1 \times (t_0-0)]$ of the voltage ($+V_1$) in the light emitting period is canceled by the integral intensity $[-V_2 \times (2t_0-t_0)]$ of the voltage ($-V_2$) in the non-light emitting period.

Even when the duty ratio is set to a value other than 50% as sown in FIG. 1C, assuming that a current ($+I_1$) is to be supplied in the light emitting period, a current ($-I_2$) to be supplied in the non-light emitting period can be determined in the same manner as that described above.

Such a current waveform is optimized such that as shown in FIG. 1C, the integral intensity $[+I_1 \times (t_1-0)]$ of the current ($I_1$) in the light emitting period is not equal to the integral intensity $[-I_2 \times (t_2-t_1)]$ of the current ($-I_2$) in the non-light emitting period, whereas the integral intensity $[+V_1 \times (t_1-0)]$ of the voltage ($+V_1$) in the light emitting period is canceled by the integral intensity $[-V_2 \times (t_2-t_1)]$ of the voltage ($-V_2$) in the non-light emitting period.

FIG. 3A shows a drive waveform applied to a specific pixel before optimized by a voltage control drive method of the present invention, and FIGS. 3B and 3C show drive waveforms optimized by the voltage control drive method of the present invention, wherein FIG. 3B shows the drive waveform when the duty ratio is set to 50%, and FIG. 3C shows the drive waveform when the duty ratio is set to a value other than 50%.

According to the method of driving an organic EL device with voltage control in accordance with the present invention, a voltage waveform in a one image display period is optimized as follows.

When the duty ratio is set to 50% and thereby a one image display period is divided into 50% of a light emitting period (0 to $t_0$) and 50% of a non-light emitting period ($t_0$ to $2t_0$) as shown in FIG. 3B, assuming that a voltage ($+V_1$) is to be applied in the light emitting period, a voltage to be applied in the non-light emitting period can be determined on the basis of the following calculation step (1).

(1) A voltage ($-V_2$) in the non-light emitting period, which has a polarity reversed to that of the voltage ($+V_1$), is obtained by satisfying a relationship that an integral value $[+V_1 \times (t_0 - 0)]$ of the voltage ($+V_1$) in the light emitting period is equal to an integral value $[-V_2 \times (2t_0 - 0)]$ of the voltage ($-V_2$) in the non-light emitting period. It is to be noted that when the duty ratio of 50%, the value $V_2$ is equal to the value $V_1$.

The voltage ($-V_2$) thus obtained is a voltage to be applied in the non-light emitting period.

Such a voltage waveform is optimized such that as shown in FIG. 3B, the integral intensity $[+V_1 \times (t_0 - 0)]$ of the voltage ($+V_1$) in the light emitting period is canceled by the integral intensity $[-V_2 \times (2t_0 - t_0)]$ of the voltage ($-V_2$) in the non-light emitting period.

Even when the duty ratio is set to a value other than 50% as shown in FIG. 3C, assuming that a voltage ($+V_1$) is to be applied in the light emitting period, a voltage ($-V_2$) to be applied in the non-light emitting period can be determined in the same manner as that described above.

Such a voltage waveform is optimized such that as shown in FIG. 3C, the integral intensity $[+V_1 \times (t_1 - 0)]$ of the voltage ($+V_1$) in the light emitting period is canceled by the integral intensity $[-V_2 \times (t_2 - t_1)]$ of the voltage ($-V_2$) in the non-light emitting period.

In this way, according to the present invention, for each image display period, a current or voltage in the non-light emitting period, which has a polarity reversed to that in the light emitting period, is obtained and is optimized such that the integral value of the voltage in the light emitting period is canceled by the integral value of the voltage in the non-light emitting period. Accordingly, it is possible to certainly prevent polarization of an ion species which leads to deterioration of the device and also prevent electrochemical reaction at the interface, and hence to improve the reliability of the device and prolong the service life thereof.

The determination of the optimized waveform before practice of the current control drive method, however, has a large problem. In this embodiment, as described above, the determination of the optimized waveform is performed by using a voltage-current curve; however, data of such a voltage-current curve are generally measured in a state that an output by an applied voltage (current) becomes steady. On the other hand, in the case where the one image display period is 16.7 ms and the duty ratio is 50%, each of the light emitting region and the non light emitting region becomes 8.35 ms, and thereby it is apparent that there is a non-steady state (transient state). Accordingly, to put an integral value of a voltage at a micro time point into zero, the data of the voltage-current curve obtained in the steady state cannot be used as they are.

Figure 4:
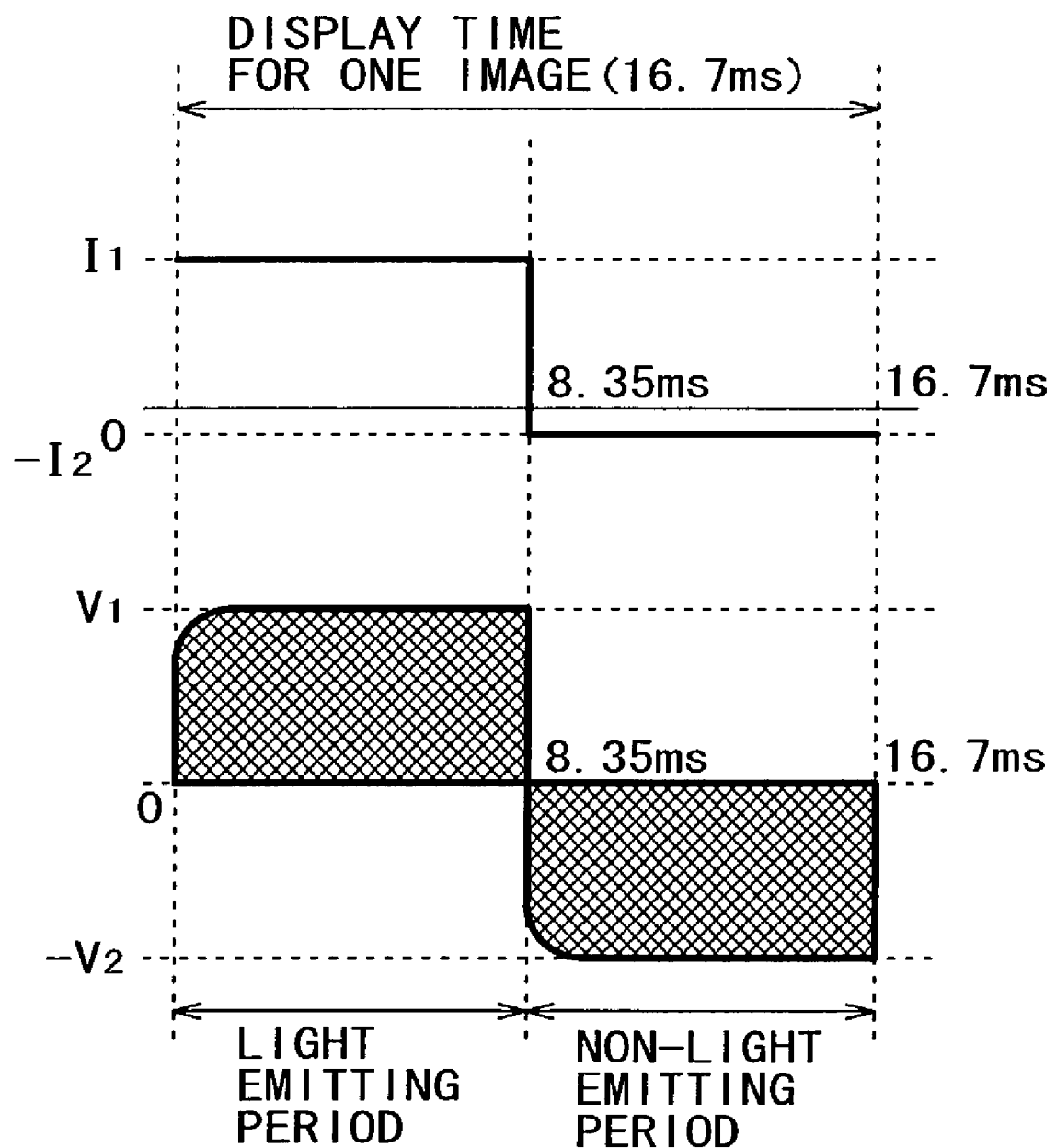
FIG. 4 is a diagram showing one example of modifying the drive waveforms obtained by the drive method of the present invention.

For this reason, according to the present invention, depending on the structure of an organic EL structure (for example, in the case where the one image display period is 16.7 ms and the duty ratio is 50%), the waveform determined on the basis of the data of the voltage-current curve obtained in the steady state is further optimized as shown in FIG. 4.

Further, as shown in FIG. 5 (duty ratio: 50%), a waveform may be equally or non-equally divided into a plurality waveform sets in the one image display period, and in each set of a light emitting period and a non-light emitting period, a current having a reversed polarity in the non-light emitting period may be optimized such that an integral value of the voltage in the light emitting period is canceled by an integral value of the voltage in the non-light emitting period. With such division of the waveform, the effective drive frequency is increased. As a result, it is possible to suppress the migration of an ion species and electrochemical reaction at the interface, and hence to obtain an effective waveform.

Figure 6A:
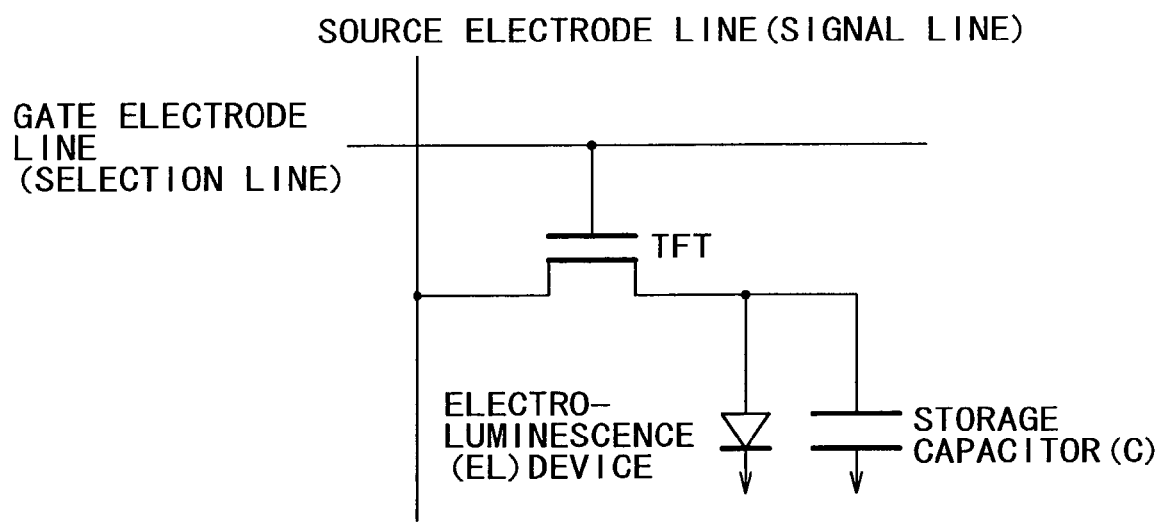
FIG. 6A is an equivalent circuit of a pixel of an electroluminescent device driven by the drive method of the present invention.
Figure 6B:
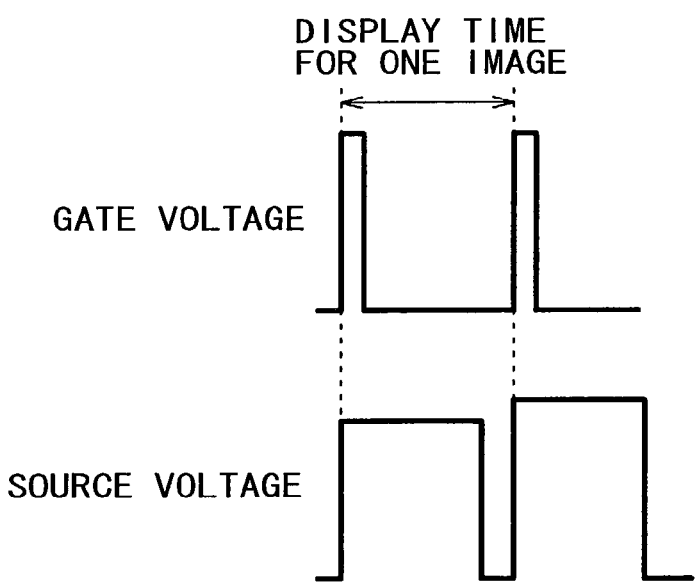
FIG. 6B is a diagram showing a waveform of a selection signal and a signal voltage applied to the device.

FIG. 6 shows a configuration example of one pixel of the EL device of the present invention. A signal voltage having a waveform, such as that shown in FIG. 1A, is applied from a source electrode line (signal line) to the EL device via a transfer gate composed of a TFT (Thin Film Transistor) selected by a gate electrode line (selection line), whereby the EL device emits light in response to an injected amount of current, and simultaneously the voltage is maintained by a storage capacitor (C) until the next signal voltage is applied to the EL device.

Figure 7A:
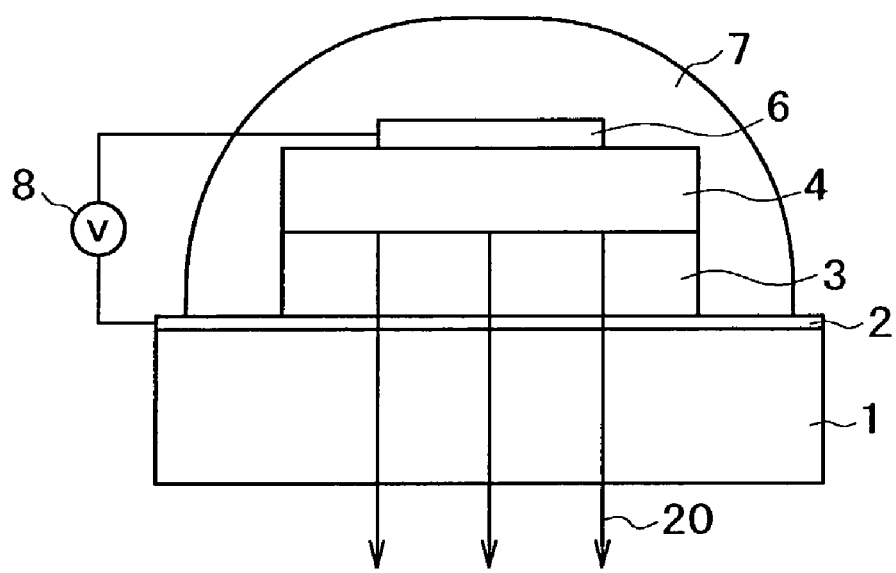
FIGS. 7A and 7B are schematic sectional views each showing a structure example of an organic electroluminescent device driven by the drive method of the present invention.
Figure 7B:
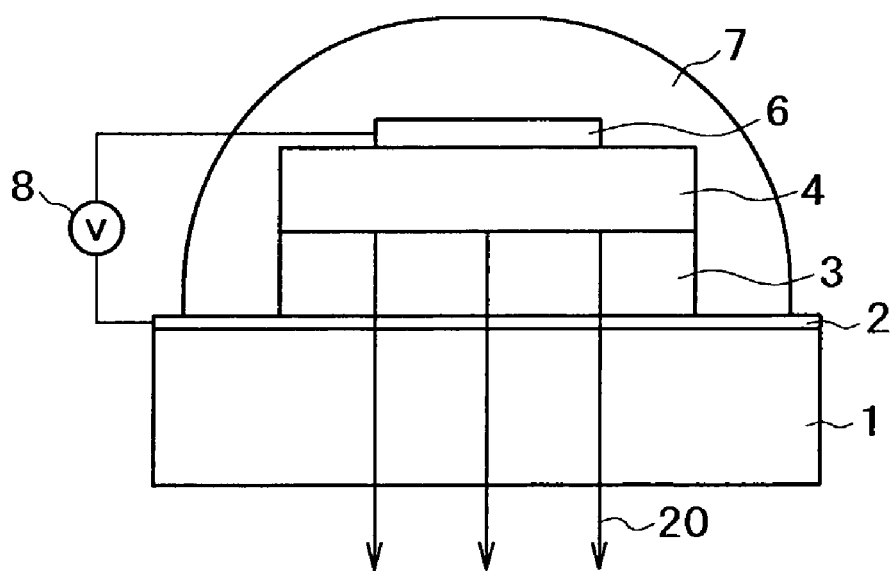

FIGS. 7A and 7B show simple structure examples of the EL devices of the present invention.

Referring to these figures, a substrate 1 for forming an EL device is made from glass, plastic, or any other suitable material. If an organic EL device is combined with another display device, the substrate may be shared by both the devices. A transparent anode electrode 2 is made from ITO (Indium Tin Oxide), $SnO_2$, or the like.

Figure 8A:
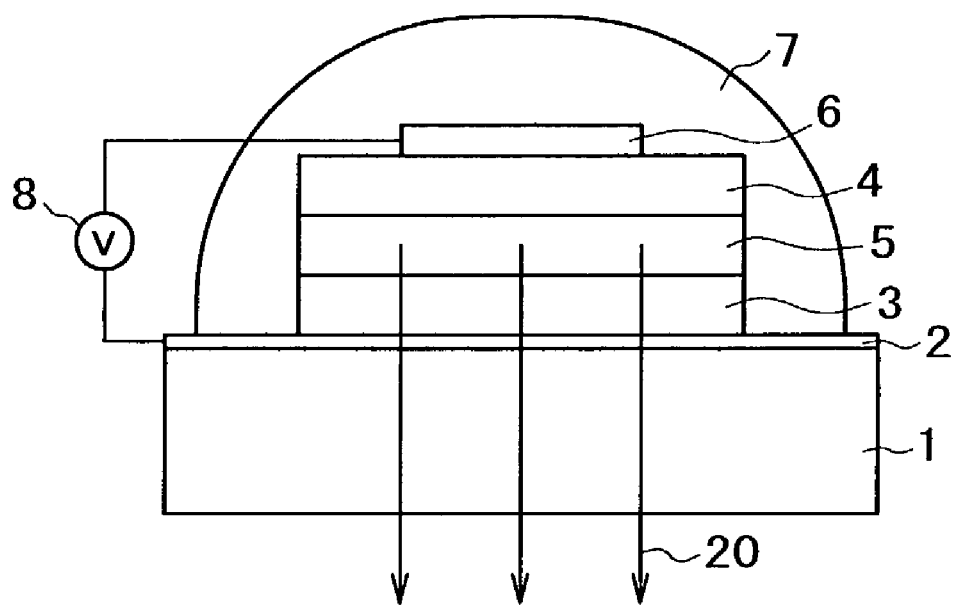
FIGS. 8A and 8B are schematic sectional views each showing a further structure example of an organic electroluminescent device driven by the drive method of the present invention.
Figure 8B:
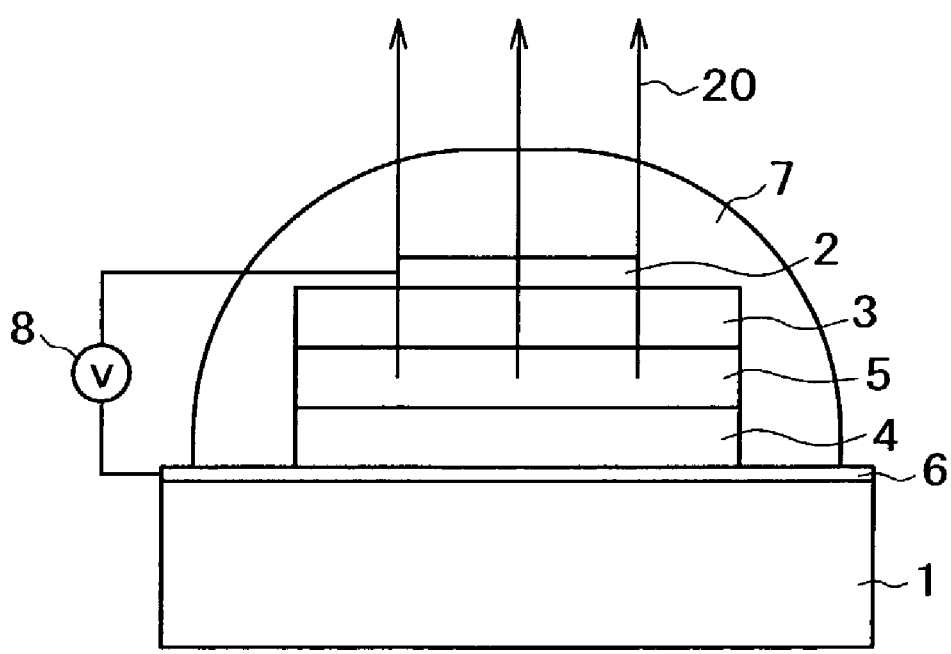

A light emitting layer is made from a known luminescent material, examples of which include a low molecular based material, a metal complex based material, a high molecular material, and a dopant based material. If the material of either the light emitting layer or an electron transport layer is luminescent, these layers may be stacked to each other. In the structure shown in FIG. 7A, a light emitting layer 4 serves as an electron transport layer and is combined with a hole transport layer 3, whereas in the structure shown in FIG. 7B, a light emitting layer 3 serves as a hole transport layer and is combined with an electron transport layer 4. To enhance a charge transport characteristic, either or each of the hole transport layer and the electron transport layers may be a stacked structure having thin films made from a plurality of materials or a thin film made from a composition containing a plurality of materials without departing from the scope of the present invention. Also, to enhance a light emitting characteristic, as shown in FIGS. 8A and 8B, a light emitting layer 5 made from at least one or more kinds of phosphor materials may be held between a hole transport layer 3 and an electron transport layer 4, or at least one or more kinds of phosphor materials may be contained in either or each of the hole transport layer 3 and the electron transport layer 4. In each case, to improve the luminous efficiency, the layer structure contains a thin film for transporting holes and/or a thin film for transporting electrons.

A cathode 6 is made from an electrode material, examples of which include an alloy of an active metal such as lithium, magnesium, or calcium with a metal such as silver, aluminum, or indium; and a metal salt of the active metal. Alternatively, the cathode 6 may be of a stacked structure having a plurality of layers made from the above materials. In this case, to realize a long-term service life, specifically, increase the half-value time of luminance, to reduce the electrode voltage, and to improve the luminous efficiency, it is preferable that a layer made from an alkali metal or an alkali earth metal, for example, lithium, sodium, or calcium, or a salt thereof be provided on the cathode side in such a manner as to be in contact with a layer having a light emitting region.

A protective layer 8 may be provided to seal the whole of the EL device for enhancing the effect of the present invention. If the protective layer 8 is provided so as to ensure air-tightness of the interior of the EL device, it is possible to enhance the degree of freedom in selection of the material for forming each of the layers of the device structure.

The EL device of the present invention may have a stacked structure called as a single-hetero structure, in which the light emitting layer serving as the electron transport layer and the hole transport layer are stacked (see FIG. 7A), or the light emitting layer serving as the hole transport layer and the electron transport layer are stacked (see FIG. 7B). Alternatively, the EL device of the present invention may have a stacked structure called as a double-hetero structure, in which the hole transport layer, the light emitting layer, and the electron transport layer are stacked (see FIGS. 8A and 8B).

In addition, the EL device may be configured such that light emission 20 emerges on the glass or plastic made substrate side as shown in FIG. 8A, or light emission 20 emerges on the protective layer 7 side as shown in FIG. 8B. In the figure, reference numeral 8 denotes a power source.

EXAMPLES

The present invention will be more fully described by way of the following examples, although the present invention is not limited thereto.

First, organic electroluminescent (EL) devices having device structures 1 to 3 used in Examples 1 to 14 and Comparative Examples 1 to 3 were prepared.

<Device Structure 1>

Figure 9A:
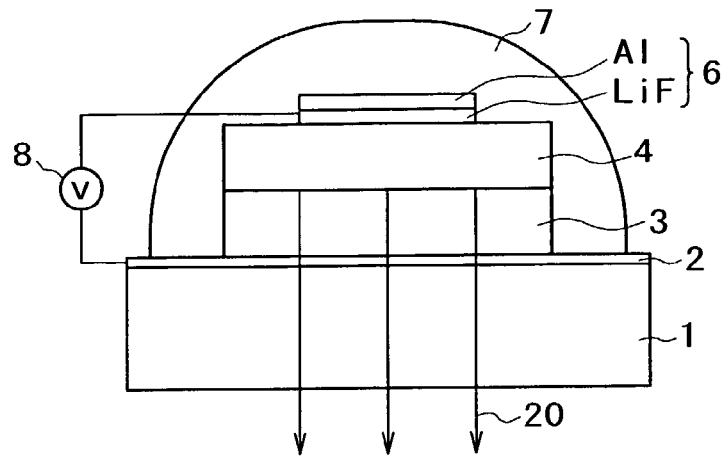
FIG. 9A is a schematic sectional view showing a device structure 1 of an organic electroluminescent device driven by a drive method in examples of the present invention.

A device structure 1 of an organic EL device used in Examples is shown in FIG. 9A.

In this figure, reference numeral 1 denotes a substrate, 2 is an anode (ITO), 3 is a hole transport layer (TDP), 4 is a light-emitting layer (Alq$_3$), 6 is a double-layered cathode made from Al/LiF, 7 is a protective layer, 8 is a power source, and 20 is emission light.

To form respective layers of the organic EL device having the device structure 1, there were used known materials: Alq$_3$ (tris(8-quinolinol)aluminum) as a luminescent material, TPD (N,N'-bis(3-methylphenyl)-1,1'-biphenyl-4,4'-diamine) as a hole transport material, ITO as an anode material, and LiF and Al as a cathode material.

The structural formulas of Alq$_3$ and TPD are as follows:

Alq$_3$:

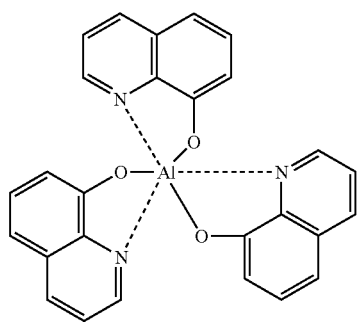

TDP:

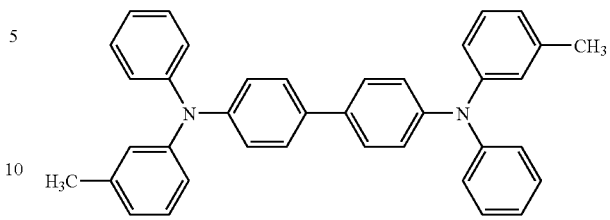

A glass substrate having a size of 30 mm×30 mm, on one surface of which an anode made from ITO was previously formed to a thickness of 100 nm, was set in a vacuum vapor-deposition system. A metal mask (vapor-deposition mask) having a plurality of unit openings each having a size of 2.0 mm×2.0 mm was disposed in proximity to the substrate. In this state, the hole transport material TPD was deposited on the anode to a thickness of, for example, 50 nm in a vacuum of $10^{-4}$ Pa or less by a vacuum vapor-deposition process. The vapor-deposition rate was set to 0.1 nm/sec. The luminescent material Alq$_3$ was then vapor-deposited on the hole transport layer to a thickness of, for example, 50 nm. The vapor-deposition rate was set to 0.2 nm/sec.

One cathode material LiF was vapor-deposited on the light-emitting layer to a thickness of, for example, 0.5 nm and the other cathode material Al was formed on the LiF layer to a thickness of, for example, 150 nm, to form a stacked film as a cathode. The vapor-deposition rate of LiF was set to 0.05 nm/sec, and the vapor-deposition rate of Al was set to 1 nm/sec. A protective layer was formed on the cathode layer. In this way, the organic EL device having the device structure 1 shown in FIG. 9A used for Examples 1 to 12 and Comparative Example 1 was produced.

The light-emitting characteristic of the organic EL device having the device structure 1 thus obtained was evaluated in a condition with a forward-biased DC voltage applied thereto in a nitrogen atmosphere. The color of light emitted from the organic EL device was green, and as a result of spectral analysis by a spectrometer using a photodiode array available from Otsuka Electronics Co., Ltd. as a detector, a spectrum having a light emission peak near 560 nm was obtained.

Figure 9B:
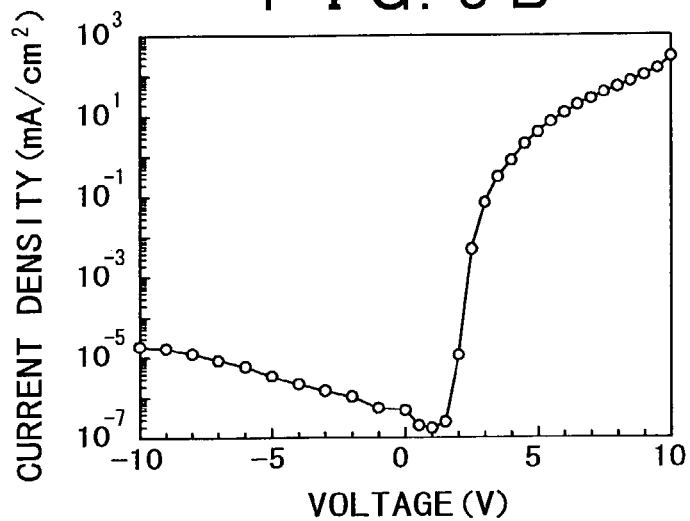
FIGS. 9B and 9C are diagrams showing a voltage-current characteristic and a voltage-luminance characteristic of the device structure 1, respectively.

A voltage-current characteristic of the organic EL device having the device structure 1 was measured. The result is shown in FIG. 9B.

Figure 9C:
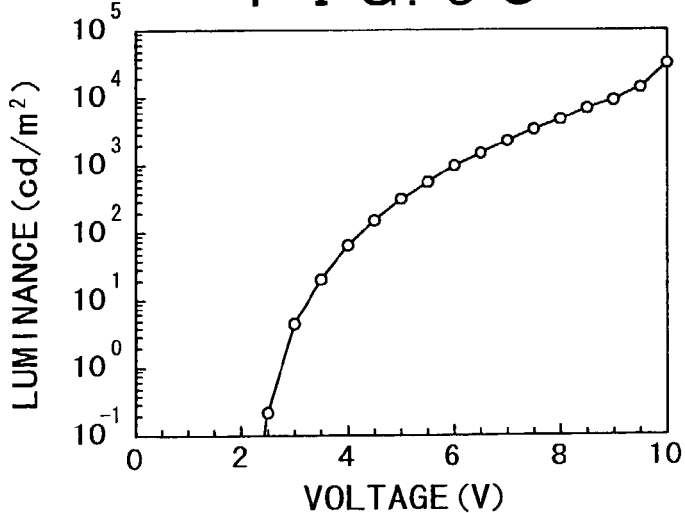

A voltage-luminescence characteristic of the organic EL device having the device structure 1 was measured. The result is shown in FIG. 9C.

<Device Structure 2>

Figure 10A:
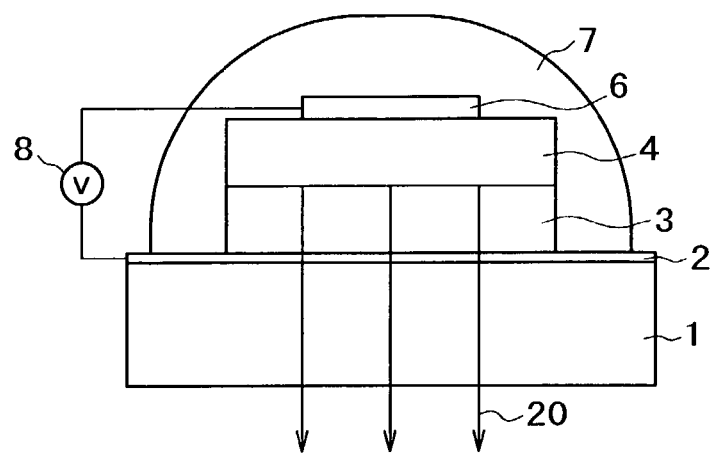
FIG. 10A is a schematic sectional view showing a device structure 2 of an organic electroluminescent device driven by a drive method in examples of the present invention.

A device structure 2 of an organic EL device used in Examples is shown in FIG. 10A.

In this figure, reference numeral 1 denotes a substrate, 2 is an anode (ITO), 3 is a hole transport layer (TDP), 4 is a light-emitting layer (Alq$_3$), 6 is a cathode made from Al, 7 is a protective layer, 8 is a power source, and 20 is emission light.

As is apparent from FIGS. 9A and 10A, the device structure 2 is the same as the device structure 1 except that the cathode 6 in the device structure 2 is made from Al, although the cathode 6 in the device structure 1 is made from LiF and Al.

An organic EL device having the device structure 2 shown in FIG. 10A used for Example 13 and Comparative Example 2 was produced in the same manner as that described above except that the formation of the LiF layer was omitted.

The light-emitting characteristic of the organic EL device having the device structure 2 thus obtained was evaluated in a condition with a forward-biased DC voltage applied thereto in a nitrogen atmosphere. The color of light emitted from the organic EL device was green, and as a result of spectral analysis by the above-described spectrometer using the photodiode array available from Otsuka Electronics Co., Ltd. as the detector, a spectrum having a light emission peak near 560 nm was obtained.

Figure 10B:
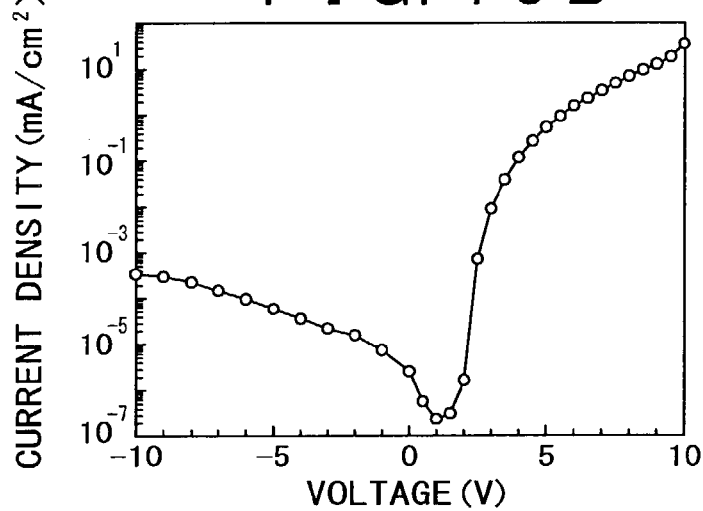
FIGS. 10B and 10C are diagrams showing a voltage-current characteristic and a voltage-luminance characteristic of the device structure 2, respectively.

A voltage-current characteristic of the organic EL device having the device structure 2 was measured. The result is shown in FIG. 10B.

Figure 10C:
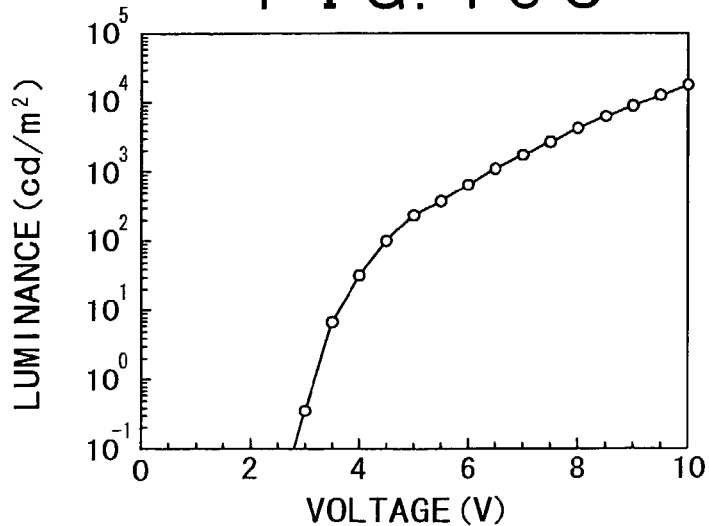

A voltage-luminescence characteristic of the organic EL device having the device structure 2 was measured. The result is shown in FIG. 10C.

<Device Structure 3>

Figure 11A:
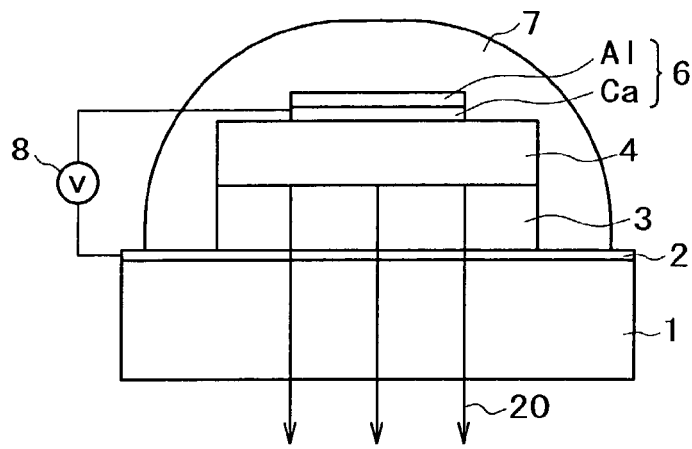
FIG. 11A is a schematic sectional view showing a device structure 3 of an organic electroluminescent device driven by a drive method in examples of the present invention.

A device structure 3 of an organic EL device used in Examples is shown in FIG. 11A.

In this figure, reference numeral 1 denotes a substrate, 2 is an anode (ITO), 3 is a hole transport layer (PEDOT), 4 is a light-emitting layer (MEH-PPV), 6 is a double-layered cathode made from Al/Ca, 7 is a protective layer, 8 is a power source, and 20 is emission light.

To form respective layers of the organic EL device having the device structure 3, there were used known materials: MEH-PPV (poly(2-methoxy-5-(2'-ethylhexyloxy)-1,4-phenylenevinylene)) as a luminescent material, PEDOT (poly(3,4-ethylenedioxythiophene)) available from Bayer Co., Ltd. as a hole transport material, ITO as an anode material, and Ca and Al as a cathode material.

The structural formulas of MEH-PPV and PEDOT are as follows:

MEH-PPV:

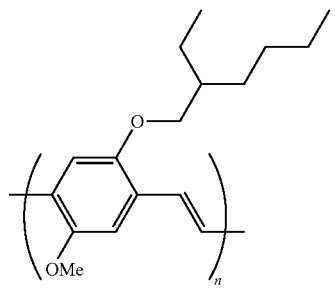

PEDOT:

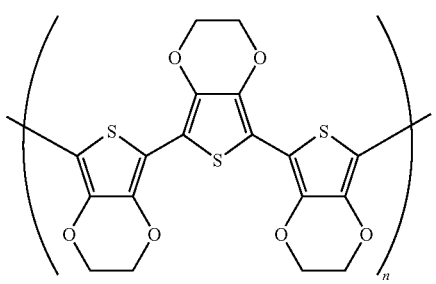

A glass substrate having a size of 30 mm×30 mm, on one surface of which an anode made from ITO (thickness: 100 nm) was previously formed, was prepared. The hole transport material PEDOT was formed on the anode by a spin coat process. The resultant PEDOT material was dried and baked in a clean oven kept in atmosphere air at 120° C. for 2 hr, to form a hole transport layer having a thickness of 50 nm. A xylene solution of the luminescent material MEH-PPV was applied on the hole transport layer in a glove box filled with nitrogen gas for keeping an environment from which oxygen and water content were removed. The resultant solution was dried and baked at 70° C. for 2 hr, to form a light-emitting layer having a thickness of 100 nm.

The resultant substrate was transferred in a vacuum vapor-deposition system while not exposed to atmospheric air. In this state, one cathode material Ca was vapor-deposited on the light-emitting layer to a thickness of, for example, 100 nm and the other cathode material Al was formed on the Ca layer to a thickness of, for example, 150 nm, to form a stacked film as a cathode in a vacuum of $10^{-4}$ Pa or less by a vacuum vapor-deposition process. The vapor-deposition rate of Ca was set to 1 nm/sec, and the vapor-deposition rate of Al was set to 1 nm/sec. A protective layer was formed on the cathode layer. In this way, the organic EL device having the device structure 3 shown in FIG. 11A used for Example 14 and Comparative Example 3 was produced.

The light-emitting characteristic of the organic EL device having the device structure 3 thus obtained was evaluated in a condition with a forward-biased DC voltage applied thereto in a nitrogen atmosphere. The color of light emitted from the organic EL device was orange.

Figure 11B:
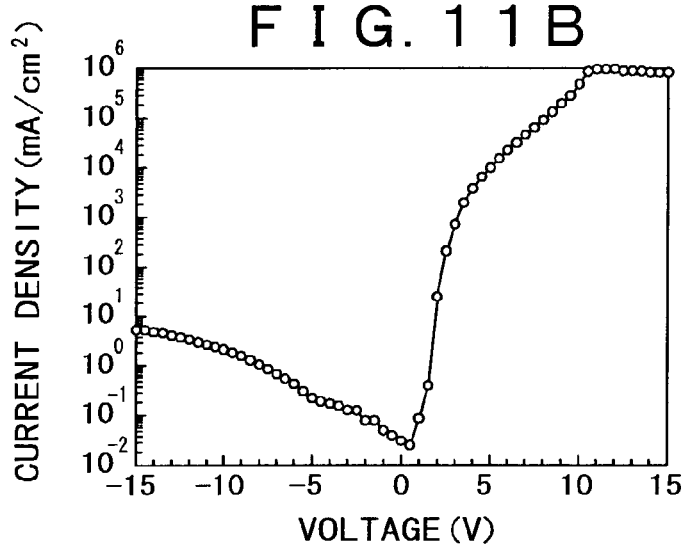
FIGS. 11B and 11C are diagrams showing a voltage-current characteristic and a voltage-luminance characteristic of the device structure 3, respectively.

A voltage-current characteristic of the organic EL device having the device structure 3 was measured. The result is shown in FIG. 11B.

Figure 11C:
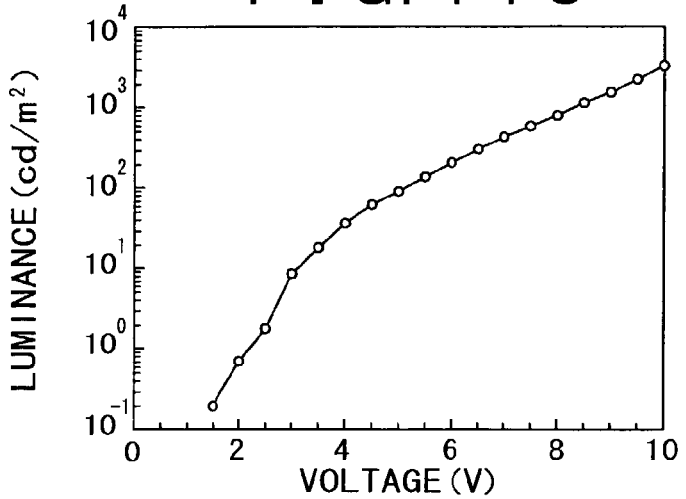

A voltage-luminescence characteristic of the organic EL device having the device structure 3 was measured. The result is shown in FIG. 11C.

Comparative Example 1

Figure 12:
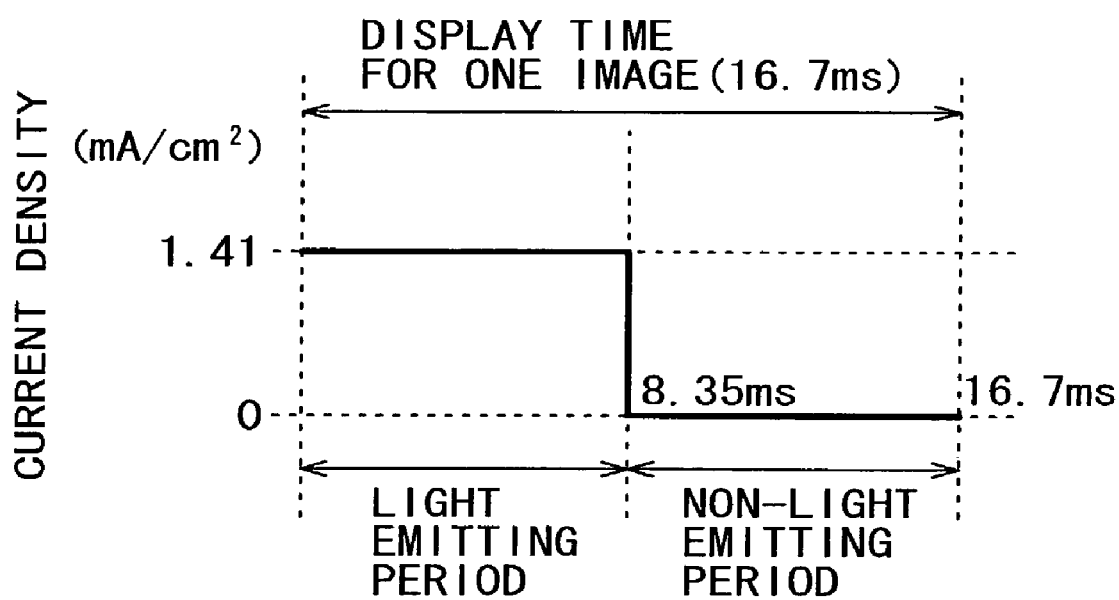
FIG. 12 is a diagram showing a drive waveform in a one image display period, which waveform is applied to the organic electroluminescent device having the device structure 1 in Comparative Example 1.

In this comparative example, the organic EL device having the device structure 1 was driven with current control based on a quasi-monopolar type current waveform shown in FIG. 12.

As shown in FIG. 12, a one image display period was taken as 16.7 ms at a frequency of 60 Hz, whereby an image display time in the one image display period was in a range of 0 to 16.7 ms.

The duty ratio was set to 50%, whereby the one image display period is divided into 50% of a light emitting period and 50% of a non-light emitting period. With this duty ratio of 50%, the initial luminance became 100 cd/m².

Further, in this comparative example, the waveform was set to a quasi-monopolar type current waveform, in which a current value was zero, that is, imaginarily in a closed circuit state in the non-light emitting period within the one image display period.

The test of forcibly deteriorating the organic EL device was performed by continuously applying the above-described quasi-monopolar type current waveform shown in FIG. 12 to the device at 25° C. with the initial luminance taken as 100 cd/m². The result showed that a time elapsed until the luminance was reduced to half was 1,200 hr.

In addition, an acceleration test for accelerating the forcible deterioration of the organic EL device was performed in the same manner as that described above except that the temperature was raised to 60° C. The result showed that a time elapsed until the luminance was reduced to half was 140 hr.

Comparative Example 2

Figure 13:
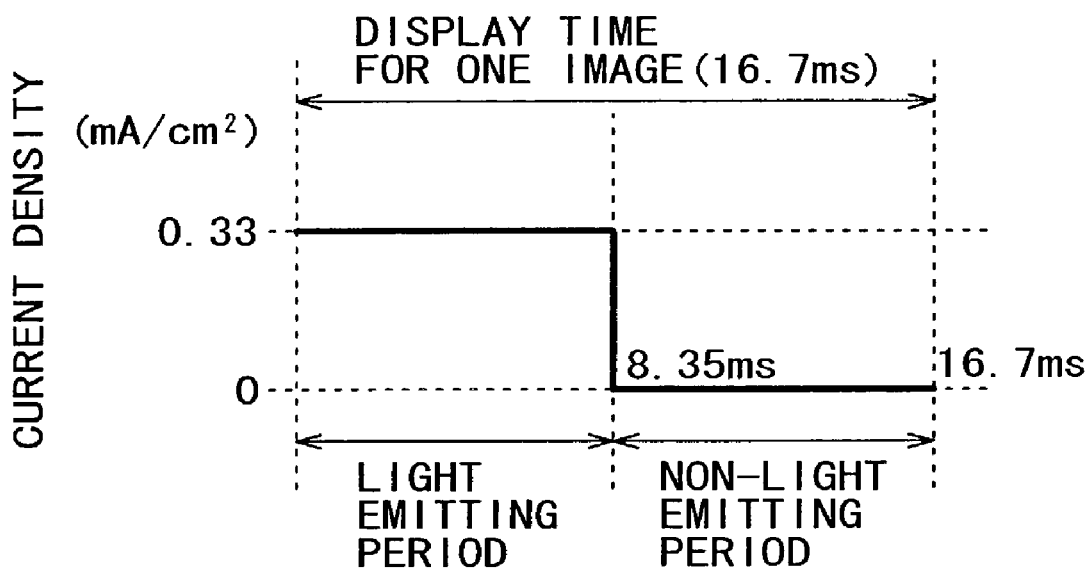
FIG. 13 is a diagram showing a drive waveform in a one image display period, which waveform is applied to the organic electroluminescent device having the device structure 2 in Comparative Example 2.

In this comparative example, the organic EL device having the device structure 2 was driven with current control based on a quasi-monopolar type current waveform shown in FIG. 13.

As shown in FIG. 13, a one image display period was taken as 16.7 ms at a frequency of 60 Hz, whereby an image display time in the one image display period was in a range of 0 to 16.7 ms.

The duty ratio was set to 50%, whereby the one image display period is divided into 50% of a light emitting period and 50% of a non-light emitting period. With this duty ratio of 50%, the initial luminance became 100 cd/m².

Further, in this comparative example, the waveform was set to a quasi-monopolar type current waveform, in which a current value was zero, that is, imaginarily in a closed circuit state in the non-light emitting period within the one image display period.

The same acceleration test as that described in Comparative Example 1 was performed by continuously applying the above-described quasi-monopolar type current waveform shown in FIG. 13 to the organic EL device at 60° C. with the initial luminance taken as 100 cd/m². The result showed that a time elapsed until the luminance was reduced to half was 110 hr.

Comparative Example 3

Figure 14:
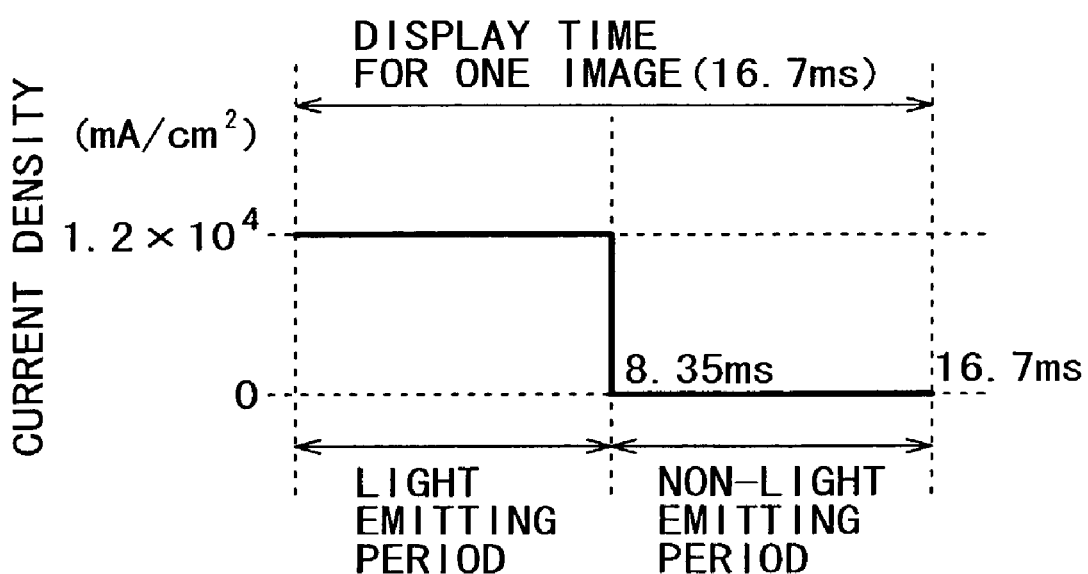
FIG. 14 is a diagram showing a drive waveform in a one image display period, which waveform is applied to the organic electroluminescent device having the device structure 3 in Comparative Example 3.

In this comparative example, the organic EL device having the device structure 3 was driven with current control based on a quasi-monopolar type current waveform shown in FIG. 14.

As shown in FIG. 14, a one image display period was taken as 16.7 ms at a frequency of 60 Hz, whereby an image display time in the one image display period was in a range of 0 to 16.7 ms.

The duty ratio was set to 50%, whereby the one image display period is divided into 50% of a light emitting period and 50% of a non-light emitting period. With this duty ratio of 50%, the initial luminance became 100 cd/m².

Further, in this comparative example, the waveform was set to a quasi-monopolar type current waveform, in which a current value was zero, that is, imaginarily in a closed circuit state in the non-light emitting period within the one image display period.

The same forcible deterioration test as that described in Comparative Example 1 was performed by continuously applying the above-described quasi-monopolar type current waveform shown in FIG. 14 to the organic EL device at 25° C. with the initial luminance taken as 100 cd/m². The result showed that a time elapsed until the luminance was reduced to half was 205 hr.

Examples 1-9

Figures 15A, 15B:
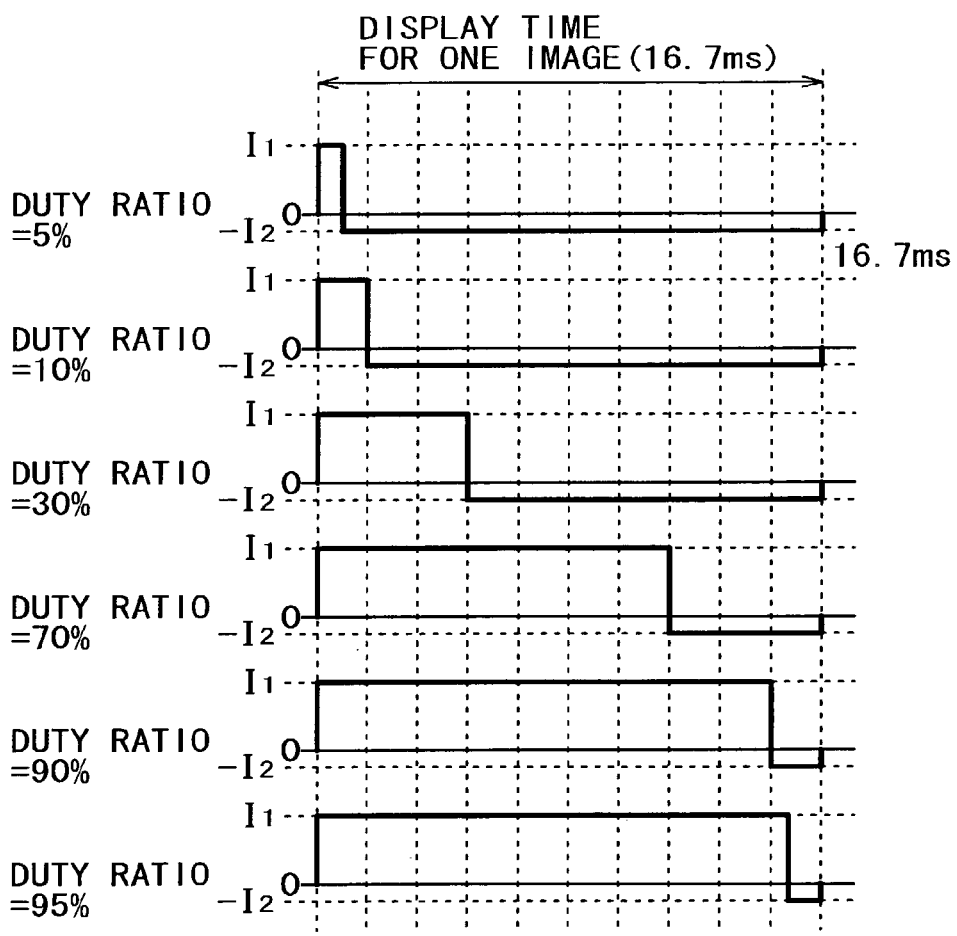
FIG. 15A is a diagram showing drive waveforms in a one image display period wherein the drive waveforms have different duty ratios, which waveforms are applied to the organic electroluminescent device having the device structure 1 in Examples 1 to 9 of the present invention.
FIG. 15B is a table showing current values and voltage values of the drive waveforms shown in FIG. 15A.

In each of these examples, the organic EL device having the device structure 1 was driven with current control based on a rectangular bipolar type current waveform shown in FIG. 15A.

As shown in FIG. 15A, a one image display period was taken as 16.7 ms at a frequency of 60 Hz, whereby an image display time in the one image display period was in a range of 0 to 16.7 ms.

The duty ratios were set to 5%, 10%, 30%, 50%, 70%, 75%, 80%, 90%, and 95% for Examples 1 to 9, respectively, whereby the one image display period in each of Examples 1 to 9 was divided into 5% (10%, 30%, 50%, 70%, 75%, 80%, 90%, 95%) of a light emitting period and 95% (90%, 70%, 50%, 30%, 25%, 20%, 10%, 5%) of a non-light emitting period. With such a duty ratio, the initial luminance became 100 cd/m².

Further, in each of Examples 1 to 9, the waveform was set to a rectangular bipolar type current waveform shown in FIG. 15A. To be more specific, a current value in the non-light emitting period was set such that the integral intensity of a voltage that corresponds to a current value in the light emitting period is substantially canceled by the integral intensity of a voltage that corresponds to the current value in the non-light emitting period and has a polarity reversed to that of the above voltage in the light emitting period.

The current ($I_1$) in the light emitting period, the current ($-I_2$) in the non-light emitting period, the voltage ($V_1$) in the light emitting period, and the voltage ($-V_2$) in the non-light emitting period in the rectangular bipolar waveform in each of Examples 1 to 9 are shown in FIG. 15B.

The organic EL device in each of Examples 1 to 9 was subjected to the same acceleration test as that described in Comparative Example 1.

The acceleration test was performed by continuously applying the above-described rectangular bipolar type current waveform shown in FIG. 15A to the organic EL device at 60° C. with the initial luminance taken as 100 cd/m², and measuring a time elapsed until the luminance was reduced to half. The results are shown in Table 1.

TABLE 1

|  | Duty Ratio (%) | Half-value Time (hr) of Luminance |
|---|---|---|
| Example 1 | 5 | 1540 |
| Example 2 | 10 | 1390 |
| Example 3 | 30 | 1130 |
| Example 4 | 50 | 750 |
| Example 5 | 70 | 620 |
| Example 6 | 75 | 210 |
| Example 7 | 80 | — |
| Example 8 | 90 | — |
| Example 9 | 95 | — |

In this test, it was found that in the case where the duty ratio is 80% or more (Examples 7, 8, 9), the voltage ($-V_2$) being in the non-light emitting period and having the polarity reversed to the voltage ($+V_1$) becomes as large as −20 V or less, to cause dielectric breakdown, thereby tending to break the organic EL device. On the other hand, in the case where the duty ratio is small, since the effective applied intensity becomes weak, the half-value time of luminance becomes longer; however, since the luminous intensity is determined by a time integral of luminance, the light emission tends to become dark.

Accordingly, it is recommended that the duty ratio be set in a range of 10 to 90%, more preferably, 30 to 70%.

With such a duty ratio (Example 2 to 8, preferably, Example 3 to 5), as shown in Table 1, the half-value time of luminance is significantly increased as compared with the half-value time of luminance in Comparative Example 1 based on the quasi-monopolar type current waveform.

Examples 10 to 12

In each of these examples, the organic EL device having the device structure 1 was driven with current control based on a rectangular bipolar type current waveform shown in FIG. 16A.

As shown in FIG. 16A, a one image display period was taken as 16.7 ms at a frequency of 60 Hz, whereby an image display time in the one image display period was in a range of 0 to 16.7 ms.

The duty ratio was set to 50%, whereby the one image display period was divided into 50% of a light emitting period and 50% of a non-light emitting period, and further, the waveform in the image display period was divided into two for Example 10, into five for Example 11, and divided into ten for Example 12, with the voltage and current values in each waveform kept constant. With such a duty ratio, the initial luminance became 100 cd/m$^2$.

Further, in each of Examples 10 to 12, the waveform was set to a rectangular bipolar type current waveform shown in FIG. 16A. To be more specific, a current value in the non-light emitting period was set such that the integral intensity of a voltage that corresponds to a current value in the light emitting period is substantially canceled by the integral intensity of a voltage that corresponds to the current value in the non-light emitting period and has a polarity reversed to that of the above voltage in the light emitting period.

The current ($I_1$) in the light emitting period, the current ($-I_2$) in the non-light emitting period, the voltage ($V_1$) in the light emitting period, and the voltage ($-V_2$) in the non-light emitting period in the rectangular bipolar waveform in each of Examples 10 to 12 are shown in FIG. 16B.

The organic EL device in each of Examples 10 to 12 was subjected to the same acceleration test as that described in Comparative Example 1.

The acceleration test was performed by continuously applying the above-described rectangular bipolar type current waveform shown in FIG. 16A to the organic EL device at 60° C. with the initial luminance taken as 100 cd/m$^2$, and measuring a time elapsed until the luminance was reduced to half. The results are shown in Table 2.

TABLE 2

|  | Duty Ratio (%) | Number of division | Half-value Time (hr) of Luminance |
|---|---|---|---|
| Example 10 | 50 | 2 | 870 |
| Example 11 | 50 | 5 | 1240 |
| Example 12 | 50 | 10 | 1420 |

As shown in Table 2, the half-value time of luminance is significantly increased as compared with the half-value time of luminance in Comparative Example 1 based on the quasi-monopolar type current waveform.

Further, as compared with the half-value time of luminance in Example 4 (duty ratio: 50%), the half-value time of luminance in each of Examples 10 to 12 is increased because of the effect of increasing the frequency by dividing the light emitting period within the one image display period.

Example 13

Figure 17:
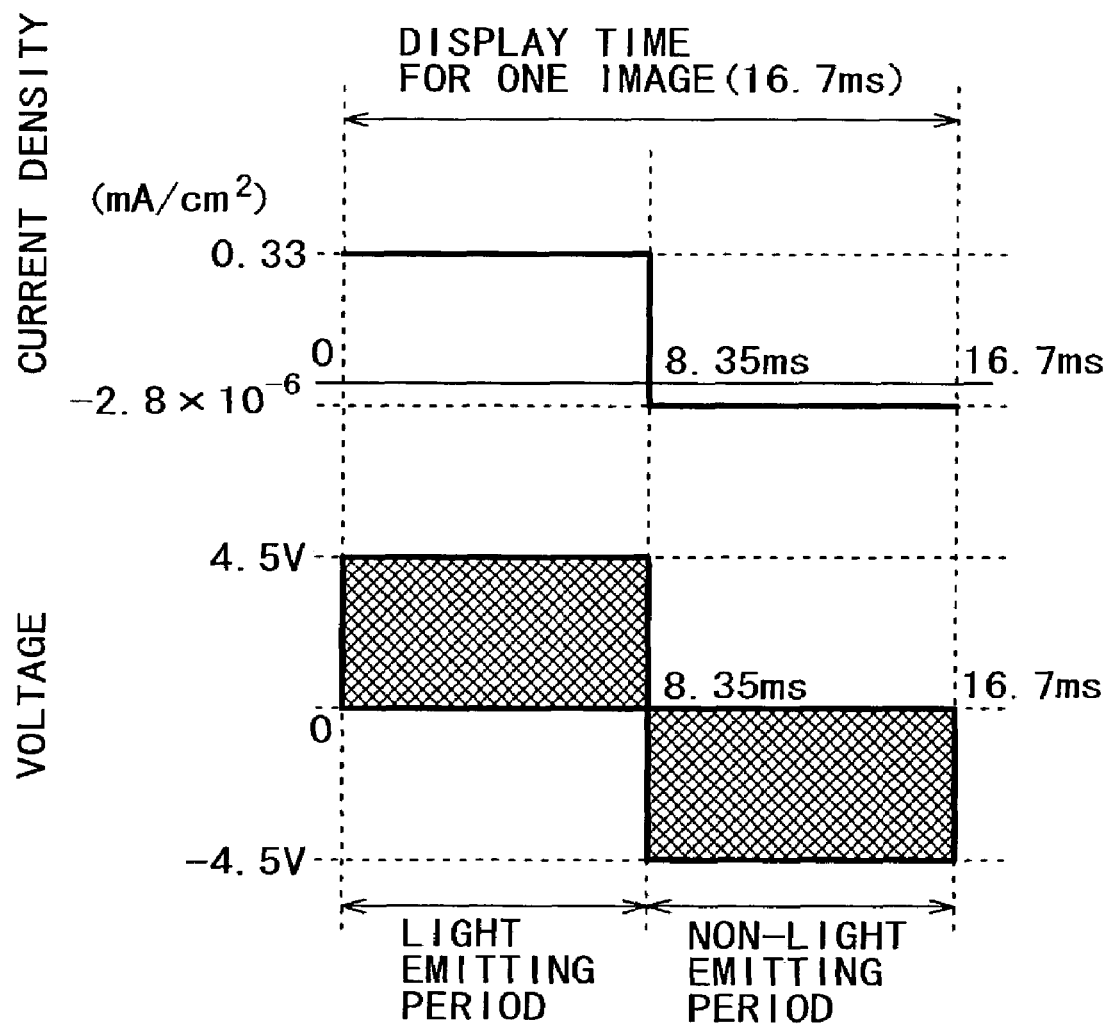
FIG. 17 is a diagram showing a drive waveform in a one image display period, which waveform is applied to the organic electroluminescent device having the device structure 2 in Example 13.

In this example, the organic EL device having the device structure 2 was driven with current control based on a rectangular bipolar type current waveform shown in FIG. 17.

As shown in FIG. 17, a one image display period was taken as 16.7 ms at a frequency of 60 Hz, whereby an image display time in the one image display period was in a range of 0 to 16.7 ms.

The duty ratio was set to 50%, whereby the one image display period is divided into 50% of a light emitting period and 50% of a non-light emitting period. With this duty ratio of 50%, the initial luminance became 100 cd/m$^2$.

Further, the waveform was set to a rectangular bipolar type current waveform shown in FIG. 17. To be more specific, a current value in the non-light emitting period was set such that the integral intensity of a voltage that corresponds to a current value in the light emitting period is substantially canceled by the integral intensity of a voltage that corresponds to the current value in the non-light emitting period and has a polarity reversed to that of the above voltage in the light emitting period.

The organic EL device was subjected to the same acceleration test as that described in Comparative Example 1.

The acceleration test of forcibly deteriorating the organic EL device was performed by continuously applying the above-described rectangular bipolar type current waveform shown in FIG. 17 to the organic EL device at 60° C. with the initial luminance taken as 100 cd/m$^2$. As a result, a time elapsed until the luminance was reduced to half was 440 hr.

The half-value time of luminance is increased as compared with the half-value time of luminance in Comparative Example 2 driven with a current of the quasi-monopolar type waveform.

The organic EL device in this example, however, cannot exhibit an effect comparable to the effect obtained by the organic EL device having the device structure 1 (Examples 1 to 5). The reason for this may be considered to be due to the fact that the cathode of the organic EL device having the device structure 2 in this example does not contain LiF. This means that the effect of the drive method of the present invention becomes large under the presence of an alkali metal species (for example, Li) liable to be ionized, and easily migratable because of relatively its small ion radius. In addition, as is well known, an organic EL device containing LiF or the like is able to reduce the electrode voltage and improve the luminous efficiency. Accordingly, to increase the effect of the drive method of the present invention, it is advantageous that the cathode of the organic EL device contains LiF.

Example 14

Figure 18:
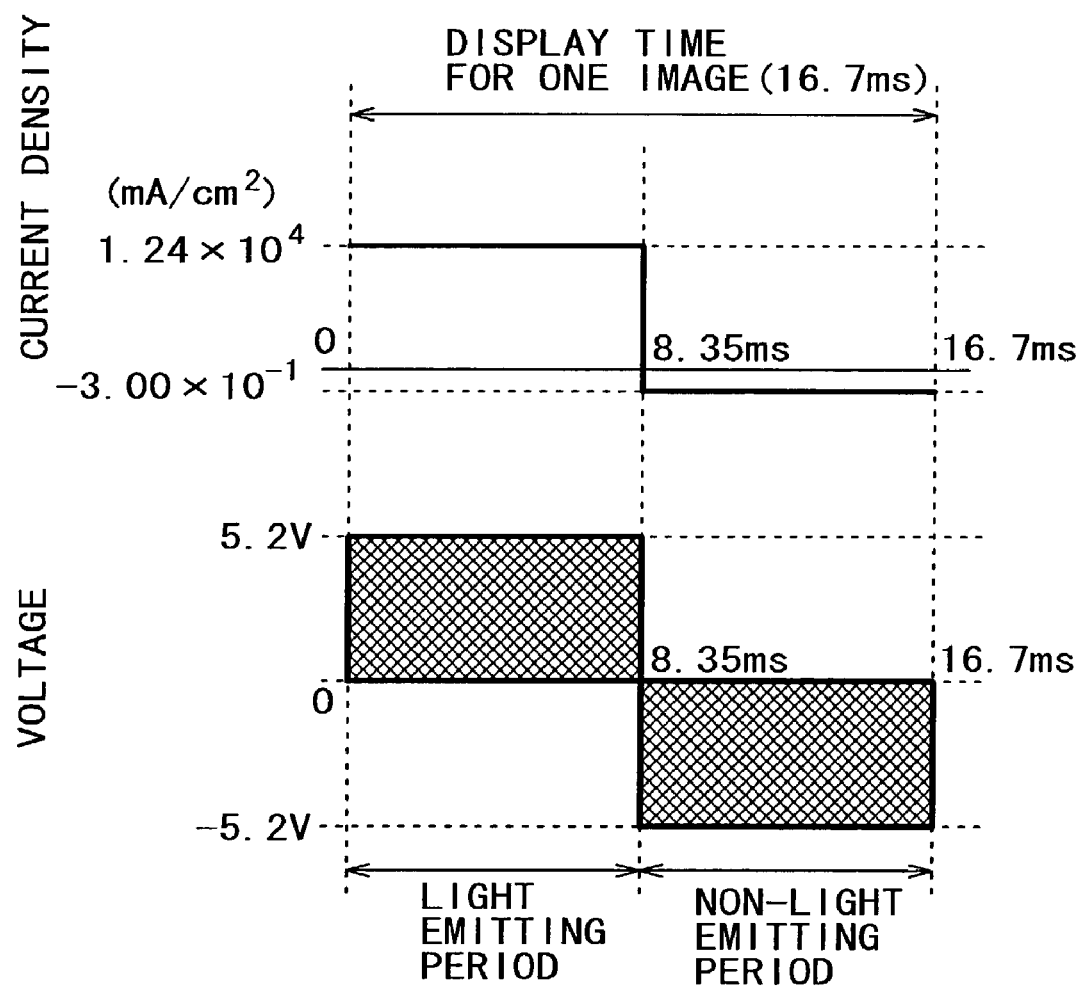
FIG. 18 is a diagram showing a drive waveform in a one image display period, which waveform is applied to the organic electroluminescent device having the device structure 3 in Example 14.

In this example, the organic EL device having the device structure 3 was driven with current control based on a rectangular bipolar type current waveform shown in FIG. 18.

As shown in FIG. 18, a one image display period was taken as 16.7 ms at a frequency of 60 Hz, whereby an image display time in the one image display period was in a range of 0 to 16.7 ms.

The duty ratio was set to 50%, whereby the one image display period is divided into 50% of a light emitting period and 50% of a non-light emitting period. With this duty ratio of 50%, the initial luminance became 100 cd/m$^2$.

Further, the waveform was set to a rectangular bipolar type current waveform shown in FIG. 18. To be more specific, a current value in the non-light emitting period was set such that the integral intensity of a voltage that corresponds to a current value in the light emitting period is substantially canceled by the integral intensity of a voltage that corresponds to the current value in the non-light emitting period and has a polarity reversed to that of the above voltage in the light emitting period.

The organic EL device was subjected to the same acceleration test as that described in Comparative Example 1.

The acceleration test of forcibly deteriorating the organic EL device was performed by continuously applying the above-described rectangular bipolar type current waveform shown in FIG. 18 to the organic EL device at 25° C. with the initial luminance taken as 100 cd/m$^2$. As a result, a time elapsed until the luminance was reduced to half was 530 hr.

This means that the drive method of the present invention is significantly effective not only for the above-described device structure using the low molecular luminescent material but also the device structure using the high molecular luminescent material or using the cathode containing Ca.

The drive waveform in a one image display period is not limited to that described above but may be changed therefrom, and each of the structure and material of an organic EL device to be driven by the drive method of the present invention is not limited to that described above but may be changed therefrom.

As described above, according to the present invention, a bipolar type waveform is applied to an organic EL device as a drive waveform per one image display period. Such a bipolar type waveform is optimized such that the one image display period is divided into a light emitting period and a non-light emitting period; a current or a voltage of a waveform, which causes an electric field reversed to that in the light emitting period, is applied in the non-light emitting period; and an integral intensity of the voltage multiplied by an applied time in the light emitting period is canceled by an integral intensity of the voltage multiplied by an applied time in the non-light emitting period. As a result, it is possible to realize a long-term service life while keeping a high luminance.

While the preferred embodiments of the present invention have been described using specific terms, such description is for illustrative purposes only, and it is to be understood that changes and variations may be made without departing from the spirit or scope of the following claims.

What is claimed is:

1. A method of driving an electroluminescent device by current control using a bipolar type drive waveform, wherein a layer having a light emitting region is provided between an anode and a cathode, said method comprising the steps of:

providing a drive waveform in a one image display period having a first drive waveform portion in a light emitting period contributing to light emission of the device and a second drive waveform portion in a non-light emitting period;

wherein the drive waveform is an asymmetric bipolar type current waveform such that a first current is supplied as the first drive waveform, and a second current is supplied as the second drive waveform, the polarity of the second current being reversed to that of the first current, and an integral intensity obtained by multiplying the absolute value of the first current by a supply time in the light emitting period is different from an integral intensity obtained by multiplying the absolute value of the second current by a supply time in the non-light emitting period; and when the first and second currents having the first and second drive waveform portions of the asymmetric bipolar current waveform are supplied, an integral intensity obtained by multiplying a first voltage between electrodes, which voltage is caused by supplying the first current, by the supply time in the light emitting period is cancelled by an integral intensity obtained by multiplying a second voltage between electrodes, which voltage is caused by supplying the second current, by the supply time in the non-light emitting period, such that the difference between the integral intensities in the light emitting period and in the non-light emitting period is substantially zero, and further wherein the first drive waveform and the second drive waveform are applied to a single light emitting region during display of a single image frame, the second drive waveform characteristics being determined based on the first drive waveform characteristics.

2. The method of driving an electroluminescent device according to claim 1, further comprising the steps of:

reading a value of the first voltage corresponding to the first current, which current is to be supplied in the light emitting period, from a voltage-current curve;

determining a value of the second voltage having a polarity reversed to that of the first voltage in accordance with a duty ratio which is a ratio of the light emitting period to the one image display period; and reading a value of the second current, which corresponds to the second voltage and has a reverse polarity, from the voltage-current curve;

wherein the second current whose value is thus calculated is supplied in the non-light emitting period.

3. The method of driving an electroluminescent device according to claim 1, wherein a duty ratio, which is a ratio of the light emitting period to the one image display period, is variable and is in a range of 30 to 70%.

4. The method of driving an electroluminescent device according to claim 1, wherein the one image display period is divided into a plurality of sets of the light emitting periods and the non-light emitting periods.

5. The method of driving an electroluminescent device according to claim 1, wherein a layer made from an alkali metal or an alkali earth metal, such as lithium, sodium, or calcium, or a salt thereof is provided on the cathode side in such a manner as to be in contact with the layer having the light emitting region.

6. A method of driving an electroluminescent device by voltage control using a bipolar type driving waveform, wherein a layer having a light emitting region is provided between an anode and a cathode, said method comprising the steps of:

providing a drive waveform in one image display period having a first drive waveform portion in a light emitting period contributing to light emission of the device and a second drive waveform portion in a non-light emitting period;

wherein the drive waveform is an asymmetric bipolar type voltage waveform comprising a first voltage having the first drive waveform portion in the light emitting period and a second voltage having the second drive waveform portion in the non-light emitting period;

wherein a polarity of the first voltage applied in the light emitting period is made opposite from a polarity of the second voltage applied in the non-light emitting period; and the drive waveform is set such that an integral intensity obtained by multiplying the first voltage by an applied time in the light emitting period is cancelled by an integral intensity obtained by multiplying the second voltage by an applied time in the non-light emitting period, therefore the difference between the integral intensities in the light emitting period and in the non-light emitting period is substantially zero, and further wherein the first drive waveform and the second drive waveform are applied to a single light emitting region during display of a single image frame, the second drive waveform characteristics being determined based on the drive waveform characteristics.

7. The method of driving an electroluminescent device according to claim 6, wherein a duty ratio, which is a ratio of the light emitting period to the one image display period, is variable and is in a range of 30 to 70%.

8. The method of driving an electroluminescent device according to claim 6, wherein the one image display period is divided into a plurality of sets of the light emitting periods and the non-light emitting periods.

9. The method of driving an electroluminescent device according to claim 6, wherein a layer made from an alkali metal or an alkali earth metal such as lithium, sodium, or calcium, or a salt thereof is provided on the cathode side in such a manner as to be in contact with the layer having the light emitting region.

10. The method of driving an electroluminescent device accordingly to claim 6, wherein a single continuous first voltage is applied in said light emitting period and a single continuous second voltage is applied is said non-light emitting period, and the absolute value of the first voltage is different from the absolute value of the second voltage.

11. The method of driving an electroluminescent device accordingly to claim 6, wherein said second voltage and/or current is applied as a function of said first voltage and/ or current, such that for every pair of light-emitting period and non-light emitting period, the integral intensity obtained by multiplying the first voltage between electrodes by the supply time in the light emitting period is cancelled by the integral intensity obtained by multiplying the second voltage between electrodes by the supply time in the non-light emitting period, such that the difference between the integral intensities in the light emitting period and in the non-light emitting period of each pair is substantially zero.

12. The method of driving an electroluminescent device accordingly to claim 6, wherein for each of said display periods there is only one light emitting period and one non-light emitting period, and during said light-emitting period, there is only one continuous assertion of the first voltage and/or current, and during said non-light-emitting period, there is only one continuous assertion of the second voltage and/or current.

13. A method of driving an electroluminescent device by current control using a bipolar type drive waveform, wherein a layer having a light emitting region is provided between an anode and a cathode, said method comprising the steps of:
providing a drive waveform in a one image display period having a first voltage having a first drive waveform portion in a light emitting period contributing to light emission of the device and a second voltage having a second drive waveform portion in a non-light emitting period, such that the polarity of the first drive waveform is opposite the polarity of the second drive waveform;
wherein an integral intensity obtained by multiplying the first voltage between electrodes by the supply time in the light emitting period is cancelled by an integral intensity obtained by multiplying the second voltage between electrodes by the supply time in the non-light emitting period, such that the difference between the integral intensities in the light emitting period and in the non-light emitting period is substantially zero, and further wherein the first drive waveform and the second drive waveform are applied to a single light emitting region during display of a single image frame, the second drive waveform characteristics being determined based on the drive waveform characteristics.

14. The method of driving an electroluminescent device accordingly to claim 1, wherein a single continuous first voltage is applied in said light emitting period and a single continuous second voltage is applied is said non-light emitting period, and the absolute value of the first voltage is different from the absolute value of the second voltage.

15. The method of driving an electroluminescent device accordingly to claim 1, wherein said second voltage and/or current is applied as a function of said first voltage and/or current, such that for every pair of light-emitting period and non-light emitting period, the integral intensity obtained by multiplying the first voltage between electrodes by the supply time in the light emitting period is cancelled by the integral intensity obtained by multiplying the second voltage between electrodes by the supply time in the non-light emitting period, such that the difference between the integral intensities in the light emitting period and in the non-light emitting period of each pair is substantially zero.

16. The method of driving an electroluminescent device accordingly to claim 1, wherein for each of said display periods there is only one light emitting period and one non-light emitting period, and during said light-emitting period, there is only one continuous assertion of the first voltage and/or current, and during said non-light-emitting period, there is only one continuous assertion of the second voltage and/or current.

17. The method of driving an electroluminescent device accordingly to claim 13, wherein a single continuous first voltage is applied in said light emitting period and a single continuous second voltage is applied is said non-light emitting period, and the absolute value of the first voltage is different from the absolute value of the second voltage.

18. The method of driving an electroluminescent device accordingly to claim 13, wherein said second voltage and/or current is applied as a function of said first voltage and/or current, such that for every pair of light-emitting period and non-light emitting period, the integral intensity obtained by multiplying the first voltage between electrodes by the supply time in the light emitting period is cancelled by the integral intensity obtained by multiplying the second voltage between electrodes by the supply time in the non-light emitting period, such that the difference between the integral intensities in the light emitting period and in the non-light emitting period of each pair is substantially zero.

19. The method of driving an electroluminescent device accordingly to claim 13, wherein for each of said display periods there is only one light emitting period and one non-light emitting period, and during said light-emitting period, there is only one continuous assertion of the first voltage and/or current, and during said non-light-emitting period, there is only one continuous assertion of the second voltage and/or current.

20. The method of driving an electroluminescent device accordingly to claim 13, wherein the duty ratio of the drive waveform varies from one image period to another.

21. A method of driving an electroluminescent device, wherein a layer having a light emitting region is provided between an anode and a cathode, said method comprising the steps of: providing a drive signal having a first drive waveform portion in a light emitting period contributing to light emission of the device and a second drive waveform portion in a non-light emitting period;
wherein a first current is supplied as the first drive waveform, and a second current is supplied as the second drive waveform, the polarity of the second current being reversed to that of the first current, and
an integral intensity of the drive waveform during the light emitting period is substantially equal to an integral intensity of the drive waveform during the non-light emitting period, and further wherein the first drive waveform and the second drive waveform are applied to a single light emitting region during display of a single image frame, the second drive waveform characteristics being determined based on the drive waveform characteristics.

* * * * *